(12) United States Patent
Quan

(10) Patent No.: US 10,651,810 B1
(45) Date of Patent: May 12, 2020

(54) FIELD EFFECT TRANSISTOR CIRCUITS

(71) Applicant: Ronald Quan, Cupertino, CA (US)

(72) Inventor: Ronald Quan, Cupertino, CA (US)

( * ) Notice: Subject to any disclaimer, the term of this patent is extended or adjusted under 35 U.S.C. 154(b) by 0 days.

(21) Appl. No.: 16/513,376

(22) Filed: Jul. 16, 2019

(51) Int. Cl.
| | |
|---|---|
| *H03K 3/33* | (2006.01) |
| *H03K 17/16* | (2006.01) |
| *H03K 19/00* | (2006.01) |
| *H01L 27/088* | (2006.01) |
| *H03K 17/042* | (2006.01) |
| *H03G 1/00* | (2006.01) |
| *H03G 3/30* | (2006.01) |
| *H03K 4/06* | (2006.01) |
| *H01L 29/808* | (2006.01) |
| *H01P 1/22* | (2006.01) |

(52) U.S. Cl.
CPC ......... *H03G 1/007* (2013.01); *H01L 29/8086* (2013.01); *H03G 3/3015* (2013.01); *H03K 4/06* (2013.01); *H01P 1/22* (2013.01)

(58) Field of Classification Search
CPC .......... H03K 4/06; H03K 4/063; H03K 4/066; H03K 4/08

USPC .......................................... 327/131, 356, 359
See application file for complete search history.

(56) References Cited

U.S. PATENT DOCUMENTS

| | | |
|---|---|---|
| 3,242,394 A | 3/1966 | Biard |
| 3,577,019 A | 5/1971 | Storm |
| 3,715,675 A | 2/1973 | Chibana |
| 4,415,860 A * | 11/1983 | Lo ............................ H03K 4/06 |
| | | 327/129 |
| 10,411,009 B1 * | 9/2019 | Quan .................... H03K 17/168 |

OTHER PUBLICATIONS

AN105 Vishay/Siliconix, "FETs As Voltage-Controlled Resistors", Mar. 10, 1997.
AN-32 "FET Circuit Applications", Literature No. SNOA620, Texas Instruments, 2011.
"Microelectronic Circuit Design", Richard Jaeger and Travis Blalock, 2011 McGraw-Hill, Section 4.2.4 Insert, MOSFET attenuator.

* cited by examiner

*Primary Examiner* — Kenneth B Wells

(57) ABSTRACT

A number of field effect transistor circuits include voltage controlled attenuators or voltage controlled processing circuits. Example circuits include modulators, lower distortion variable voltage controlled resistors, sine wave to triangle wave converters, and or servo controlled biasing circuits.

7 Claims, 23 Drawing Sheets

US 10,651,810 B1

FIELD EFFECT TRANSISTOR CIRCUITS

This application is a divisional of Ser. No. 16/051,469, now U.S. Pat. No. 10,411,009, which claims priority to U.S. provisional application Ser. No. 62/545,470 filed on Aug. 14, 2017, which is incorporated herein by reference.

BACKGROUND

The present invention relates to Field Effect Transistor (FET) circuits used in providing voltage controlled amplitude circuits, waveform shaping circuits.

SUMMARY

In one embodiment is to provide a lower distortion voltage controlled resistor via an FET, an isolation amplifier or a buffer amplifier was required. For example with a junction FET or JFET, the inclusion of a buffer amplifier did not provide as a substantial difference in lowering distortion when compared to using a MOS (Metal Oxide Silicon) FET or MOSFET. In another example, the inclusion of a buffer amplifier for a depletion mode FET did not provide as a substantial difference in lowering distortion when compared to using an enhancement mode FET. An example such as a DMOS or enhancement mode device such as a SD5000 family of FETs showed much more improvement in reducing or lowering nonlinear distortion (e.g., lowering or reducing harmonic distortion and or lowering or reducing intermodulation distortion) with an amplifier feedback circuit when compared to using feedback network without an amplifier.

One or more embodiments may include the following:
1) An improved voltage controlled resistor including an amplifier.
2) A waveshaping circuit that includes a sinewave to triangle converter circuit.
3) A multiple FET circuit including a feedback circuit to provide a substantially predetermined drain to source resistance or to provide a predetermined amount of attenuation or gain.
4) An amplitude modulator circuit and or a multiplier circuit and or mixing circuit with triangle wave modulation at its output when an input signal is a sine-wave.
5) A sinewave to triangle wave converter that is substantially frequency independent.
6) A voltage controlled inductor using one or more FET devices for lower distortion.

DETAILED DESCRIPTION

In the following example circuits including FIGS. 1, 2, 3, 4, 5, 6, 7A, 7B, 8, 9, 10, 11, 12, 13, 14, 15, 16, 17, 18, 19, 20, 21, and or 22 other values for resistors, capacitors, op amps, FETs (e.g., depletion and or enhancement field effect transistor(s)), currents and or voltages may be used.

Figure 1:
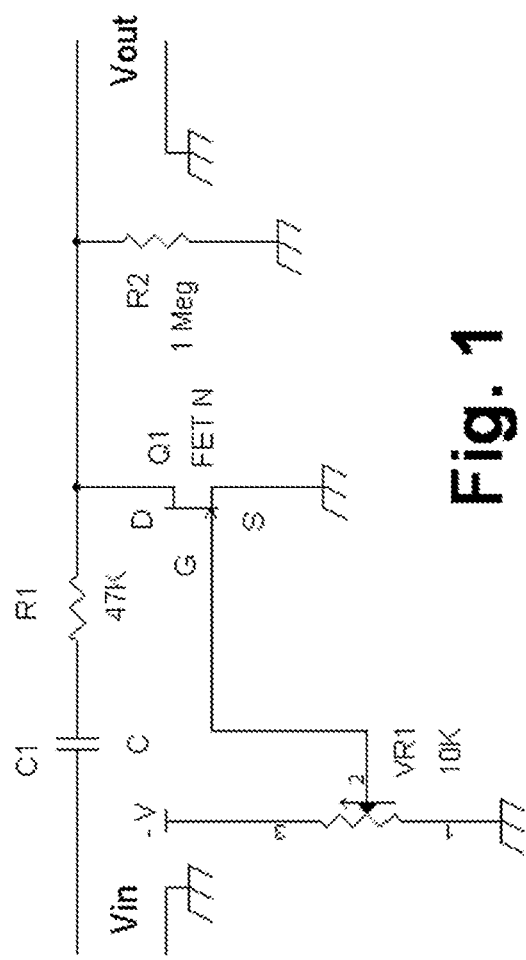
FIG. 1 shows a prior art JFET voltage controlled resistor circuit.

FIG. 1 shows a prior art voltage controlled resistor circuit where the field effect transistor Q1 is a depletion mode device. Although junction field effect transistors are generally depletion devices, there are some (but not a majority of) insulated gate or MOS (Metal Oxide Silicon) field effect transistors that are also depletion type devices. However, the majority or MOS field effect transistors (MOSFET) are enhancement mode devices.

In FIG. 1 the gate to source voltage of the FET Q1 is varied by variable resistor or variable voltage divider VR1 that provides a voltage range from 0 volts for minimum drain to source resistance to a negative voltage that provides a near open circuit resistance (e.g., very high or close to infinite resistance) across the drain and source of the FET Q1. At 0 volts gate to source voltage maximum attenuation occurs via input source resistor R1. And at a negative gate to source voltage where the drain to source resistance is nearly infinite resistance, the input signal Vin passes virtually completely (e.g., with minimum attenuation) to the output terminal Vout.

All field effect transistors have a source terminal (e.g., denoted by "S"), a gate terminal (e.g., denoted by "G"), and a drain terminal (e.g., denoted by "D"). An FET's resistance is taken across the drain and source terminals.

For a junction or depletion mode FET the drain current, $I_d$, can be characterized by the following equation in the FET's ohmic or triode region that is generally used for resistance across the drain and source terminal:

$$I_d = I_{DSS}\left[2\left(1 - \frac{Vgs}{Vp}\right)\left(\frac{Vds}{-Vp}\right) - \left(\frac{Vds}{Vp}\right)\left(\frac{Vds}{Vp}\right)\right]$$

Where $I_{DSS}$ is the maximum drain current when the gate to source voltage, Vgs=0 volt and where the cut-off voltage or pinch off voltage is Vp, which is a constant given by the data sheet of the depletion mode FET, and where Vds=drain to source voltage, and where the control voltage, Vgs, is the gate to source voltage that varies the drain to source resistance of the depletion mode FET.

A general equation for a depletion mode FET resistance from its drain to source terminals, $R_{ds}$, such is characterized by the following equation:

$$R_{ds} = 1 \Big/ \left\{I_{DSS}\left[-2\left(\frac{1}{Vp}\right)\left(1 - \frac{Vgs}{Vp}\right) - 2\left(\frac{Vds}{Vp}\right)\left(\frac{1}{Vp}\right)\right]\right\}$$

Figure 2:
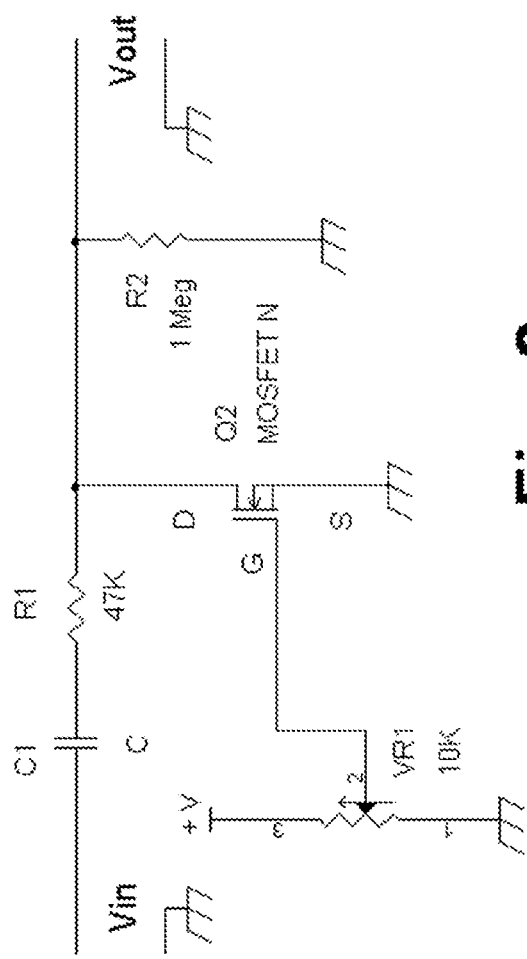
FIG. 2 shows a prior art MOSFET or enhancement mode FET voltage controlled resistor.

FIG. 2 shows an enhancement mode FET (e.g., Q2) voltage controlled resistor prior art circuit. In this circuit at 0 volts across the gate and source, the drain to source resistance is nearly infinite and the output signal Vout is almost equal to Vin. If the gate to source voltage of Q2 is increased to a positive voltage sufficiently high to provide a very low resistance from its drain to source terminal, only a small fraction of Vin will pass to Vout.

For an enhancement device, drain current, $I_d$, can be characterized by the following equation in the FET's ohmic or triode region that is generally used for resistance across the drain and source terminals:

$$I_d = \frac{k'}{2}\frac{W}{L}[2(Vgs - V_{th})Vds - (Vds)(Vds)]$$

Where W=width and L=channel length of the enhancement mode device.

k'=a constant based on the manufacturing process of the enhancement mode device and where Vds=voltage across the drain and source, and where $V_{th}$=threshold voltage, and where Vgs=gate to source voltage.

The drain to source resistance can be characterized for an enhancement mode FET as a resistance dependent on Vgs and Vds similarly described previously in the depletion mode FET drain to source resistance.

Figure 3:
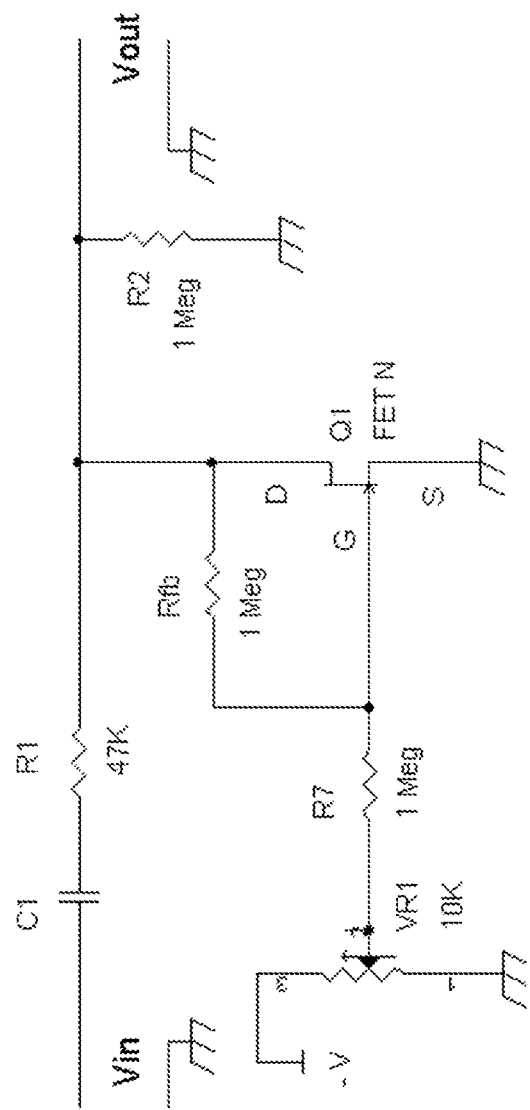
FIG. 3 shows a JFET voltage controlled resistor for lowered distortion with resistors, which for example can provide for a voltage controlled variable clipping circuit.

FIG. 3 shows a voltage controlled resistor using a depletion mode FET where feedback resistors Rfb and R7 form a feedback signal from the drain of the FET to lower distortion, which also provides a more linear drain to source resistance. To provide minimum distortion when R7 is driven with a voltage source, R7=Rfb in terms of resistance values. In FIG. 3 the examples are shown to have R7=Rfb=1 Meg ohms, but other resistance values can be used.

If the gate to source voltage Vgs=Vc+k Vds, with k=0.5, then Vgs=Vc+0.5 Vds where Vc=a control voltage then from the original equation:

$$I_d = I_{DSS}\left[2\left(1 - \frac{Vc}{Vp}\right)\left(\frac{Vds}{-Vp}\right)\right] + I_{DSS}\left[2\left(-\frac{kVds}{Vp}\right)\left(\frac{Vds}{-Vp}\right)\right] - I_{DSS}\left(\frac{Vds}{Vp}\right)\left(\frac{Vds}{Vp}\right)$$

$$I_d =$$

$$I_{DSS}\left[2\left(1 - \frac{Vc}{Vp}\right)\left(\frac{Vds}{-Vp}\right)\right] + I_{DSS}\left[2\left(-\frac{0.5Vds}{Vp}\right)\left(\frac{Vds}{-Vp}\right)\right] - I_{DSS}\left(\frac{Vds}{Vp}\right)\left(\frac{Vds}{Vp}\right)$$

$$I_d = I_{DSS}\left[2\left(1 - \frac{Vc}{Vp}\right)\left(\frac{Vds}{-Vp}\right)\right] + I_{DSS}\left[\left(-\frac{Vds}{Vp}\right)\left(\frac{Vds}{-Vp}\right)\right] - I_{DSS}\left(\frac{Vds}{Vp}\right)\left(\frac{Vds}{Vp}\right)$$

The last two terms cancel leaving:

$$I_d = I_{DSS}\left[2\left(1 - \frac{Vc}{Vp}\right)\left(\frac{Vds}{-Vp}\right)\right]$$

and this results in a drain to source resistance, $R_{ds}$, that is no longer dependent on Vds, and to a first approximation $R_{ds}$ is now dependent or a function of the control voltage, Vc:

$$R_{ds} = 1 \Big/ \left\{I_{DSS}\left[-2\left(\frac{1}{Vp}\right)\left(1 - \frac{Vc}{Vp}\right)\right]\right\}$$

Although FIG. 3 when used as a voltage controlled resistor for an attenuator circuit with a more linear drain to source resistance is prior art, this circuit have been found to have a new use as a substantially symmetrical voltage controlled variable limiter or a substantially symmetrical voltage controlled variable clipping level circuit when the input signal is increased to an amplitude beyond the constraints described by $$R_{ds} = 1 \Big/ \left\{I_{DSS}\left[-2\left(\frac{1}{Vp}\right)\left(1 - \frac{Vc}{Vp}\right)\right]\right\}.$$

By varying the control voltage Vc or the gate to source voltage, the substantially symmetrical clipping voltage is varied. Unexpectedly, the single ended circuit in FIG. 3 provides substantially symmetrical clipping, which can be varied via providing a varied voltage at the gate of the FET when Rfb and R7 are approximately equal in value and when R7 is driven with a voltage source whose equivalent output resistance is <<R7. Note that a small portion of the bias voltage from the slider of VR1 does leak through via R7 and Rfb to the drain of the FET and also to the output terminal Vout.

Figure 4:
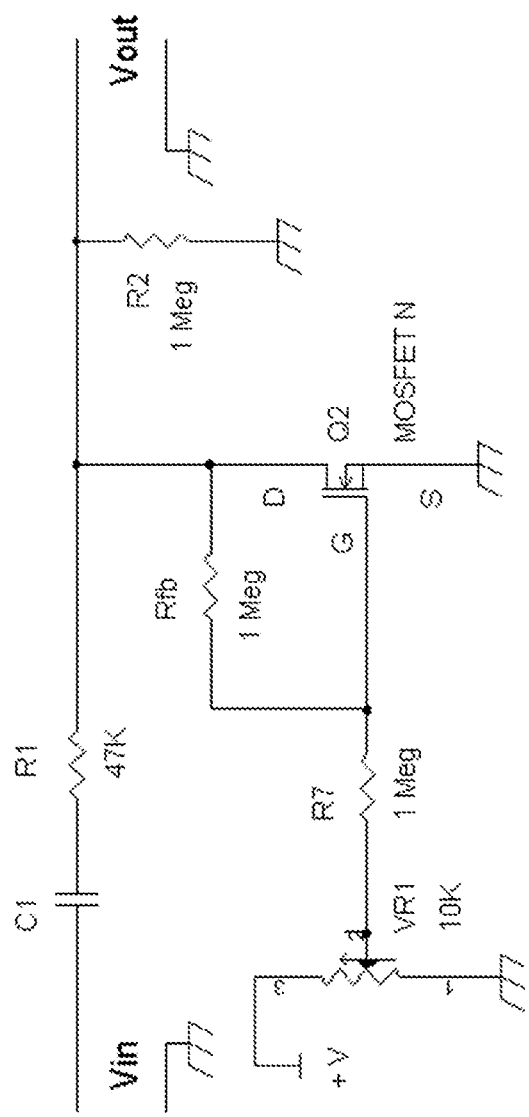
FIG. 4 shows an embodiment using an enhancement mode FET or MOSFET feedback network.

FIG. 4 shows a voltage controlled resistor circuit with reduced nonlinear drain to source resistance including an enhancement mode FET. Ideally one half of the voltage appearing at the drain is coupled to the gate of Q2 for optimal or optimum linearity. This circuit can be also used as a voltage controlled clipping circuit where the clipping voltage is changed or varied via the voltage entering R7 such as the voltage at the slider of potentiometer VR1. Note in FIG. 4 for an N channel enhancement mode device the gate of Q2 is biased with a positive voltage with respect to the source of Q2. Note that a small portion of the bias voltage from the slider of VR1 does leak through via R7 and Rfb to the drain of the FET and also to the output terminal Vout. Although with Rib and R7 substantially equal in value reduces distortion, the distortion reduction with at least some enhancement mode FETs is less than the distortion reduction with depletion mode FETs. For example, to provide a voltage controlled attenuator circuit, the circuit in FIG. 3 using a depletion mode device FET (e.g., LSK 389 or LSK489) has less distortion than the circuit in FIG. 4, which uses an enhancement mode or MOS field effect transistor (e.g., SD5000 MOSFET).

The equations showing cancellation of distortion for an enhancement mode FET is characterized in the following manner:

Let the gate to source voltage include a portion of the drain to source voltage by having Vgs→Vct+K Vds where the scaling factor K has a range of 0<K<1, and Vct is a DC bias voltage to control the FET's drain to source resistance.

$$I_d = \frac{k'}{2}\frac{W}{L}[2(Vgs - V_{th})Vds - (Vds)(Vds)]$$

Substituting Vgs→Vct+K Vds $$I_d = \frac{k'}{2}\frac{W}{L}[2(Vct + K\,Vds - V_{th})Vds - (Vds)(Vds)]$$

$$I_d = \frac{k'}{2}\frac{W}{L}[2(Vct + K\,Vds - V_{th})Vds] - \frac{k'}{2}\frac{W}{L}[(Vds)(Vds)]$$

$$I_d = \frac{k'}{2}\frac{W}{L}[2(Vct - V_{th})Vds] + \frac{k'}{2}\frac{W}{L}[2(K\,Vds)Vds] - \frac{k'}{2}\frac{W}{L}[(Vds)(Vds)]$$

To cancel out the (Vds)(Vds) term, we equate:

$$\frac{k'}{2}\frac{W}{L}[2(K\,Vds)Vds] - \frac{k'}{2}\frac{W}{L}[(Vds)(Vds)] = 0,$$

which results in:

$$\frac{k'}{2}\frac{W}{L}[2(K\,Vds)Vds] = \frac{k'}{2}\frac{W}{L}[(Vds)(Vds)]$$

Divide both sides by $$\frac{k'}{2}\frac{W}{L},$$

which results in:
[2(K Vds) Vds]=[(Vds)(Vds)], and divided both sides by (Vds)(Vds) results in:
2(K)=1, or K=½=0.5, which again states that half of the voltage at the drain of the enhancement mode FET is coupled to the gate of the enhancement mode FET.

With $$K = 1/2,$$

$$I_d = \frac{k'}{2}\frac{W}{L}[2(Vct - V_{th})Vds] + \frac{k'}{2}\frac{W}{L}\left[2\left(\frac{1}{2}Vds\right)Vds\right] - \frac{k'}{2}\frac{W}{L}[(Vds)(Vds)]$$

We see that the last two terms cancel and we are left with:

$$I_d = \frac{k'}{2}\frac{W}{L}[2(Vct - V_{th})Vds]$$

The conductance from drain to source, $g_{ds}$, when K=½=0.5 is then:

$$g_{ds} = \frac{d}{dVds}I_d = \frac{d}{dVds}\left(\frac{k'}{2}\frac{W}{L}[2(Vct - V_{th})Vds]\right) = \frac{k'}{2}\frac{W}{L}[2(Vct - V_{th})]$$

$$g_{ds} = \frac{k'}{2}\frac{W}{L}[2(Vct - V_{th})]$$

And the resistance from drain to source, $R_{ds}$ is the reciprocal of the conductance, $g_{ds}$ $$R_{ds} = 1/g_{ds} = 1 \Big/ \left(\frac{k'}{2}\frac{W}{L}[2(Vct - V_{th})]\right)$$

$$R_{ds} = 1 \Big/ \left(\frac{k'}{2}\frac{W}{L}[2(Vct - V_{th})]\right) \text{ when } K = \frac{1}{2}.$$

With the equation for $R_{ds}$ is shown above, $R_{ds}$ is now a function of Vct−$V_{th}$ where Vct provides a control signal and $V_{th}$ is the threshold voltage of the enhancement mode FET. $V_{th}$ is treated as a constant.

In at least one example where the enhancement mode FET includes an SD5000 (e.g., DMOS field effect transistor)), it was found that connecting the feedback resistor Rib directly from the drain to the gate of the enhancement mode FET did not result in optimum linearity of the drain to source resistance. An improved version to take more advantage to lower distortion (and or to increase drain to source voltage controlled resistance) included an amplifier as shown in FIG. 5 (e.g., U1A).

Figure 5:
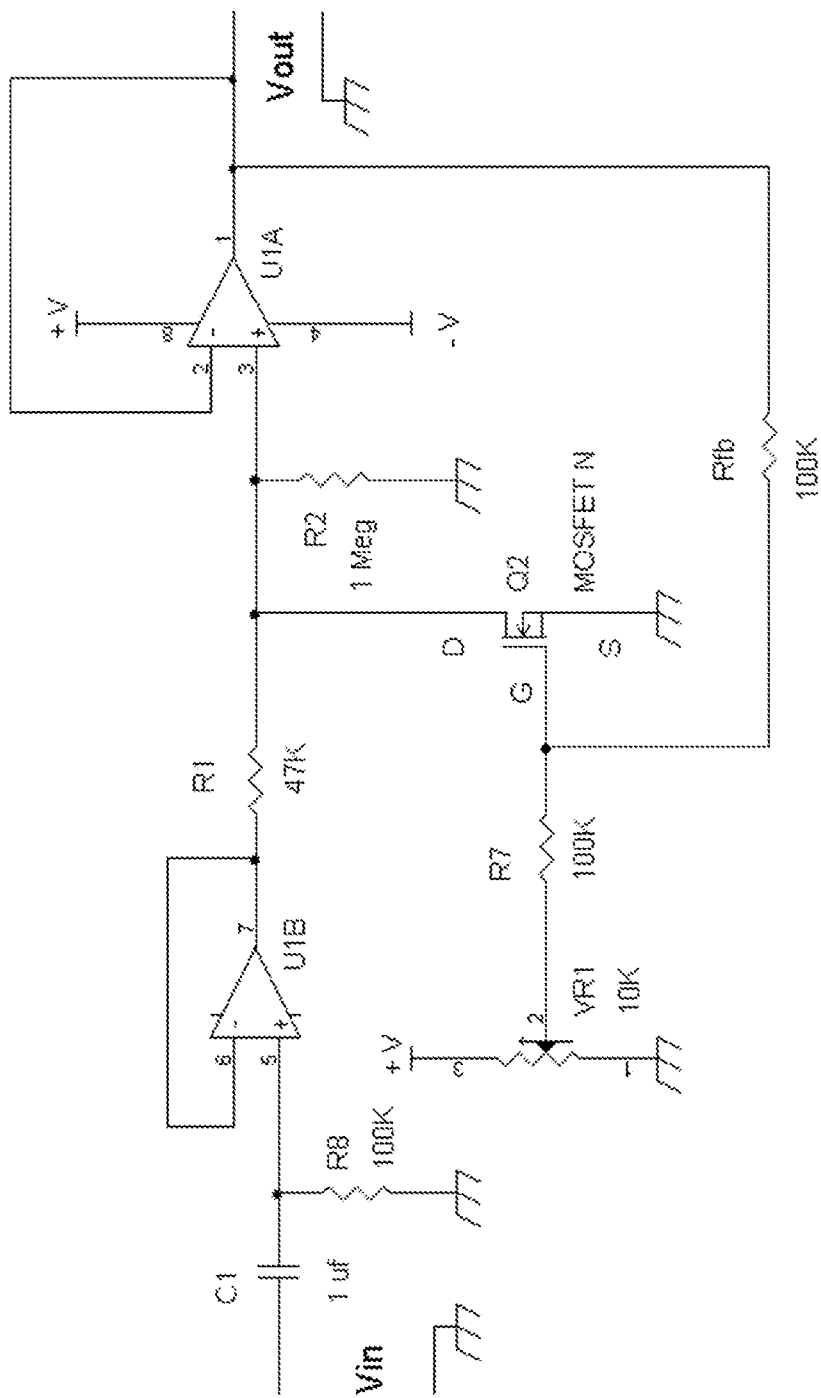
FIG. 5 shows another embodiment using a feedback amplifier with gain of substantially one.

In FIG. 5, inclusion of the amplifier (e.g., U1A) improved the voltage controlled resistor or attenuator circuit in terms of distortion (e.g., voltage controlled resistance wherein the voltage controlled resistance includes improved linearity of resistance as a function of input signal amplitude) and or improvement in prohibiting any portion of the control voltage at R7 (e.g., left side) from leaking or transferring into the drain terminal of the FET (e.g., drain terminal of Q2 the enhancement mode FET) or in prohibiting any portion of the control voltage at R7 (e.g., left side) from leaking or transferring into the output terminal Vout of the circuit in FIG. 5. In FIG. 5, amplifier U1A is configured as a voltage follower whose output resistance is <<Rfb, which effectively eliminates at the output terminal of U1A any signal voltage that is coupled via Rib such as R7. The addition of a voltage follower amplifier or an amplifier improved by reducing the distortion at the output terminal Vout versus essentially the same circuit with feedback network (e.g., Rfb and F7) shown without an amplifier in FIG. 4. Note in FIG. 5, resistor R2 is optional and can be removed for greater range of attenuation as a function of the control voltage via the wiper or slider of potentiometer VR1. Note because of the amplifier U1A, which is unity gain in this example, the feedback resistor network Rfb and R7 may be lowered in value to overcome parasitic capacitances across the terminals of Q2 that can affect frequency response. For example, capacitances across the gate and source or drain and gate can affect the (e.g., high) frequency response to the modulation of the drain to source resistance if the control voltage via VR1 is replaced with a modulating signal. The modulating signal may include a DC bias voltage and an AC modulating voltage. Another advantage of having an amplifier such as U1A is that it isolates the feedback resistor network, Rfb and R7, from the drain terminal of Q2 (e.g., which Rfb and R7 would otherwise also lower the resistance from the drain terminal to ground by paralleling a resistance at the drain terminal to ground).

In FIG. 3 for example, the feedback network Rfb and R7 is coupled in parallel to the resistance of the drain to source resistance of the FET Q1 and or to R2. This limits the attenuation range of the voltage controlled resistor circuit of FIG. 3 when compared to the circuit in FIG. 5 that does not have the feedback network resistors Rfb and R7 connected in parallel to the drain to source resistance of the FET Q2 nor to the resistor R2.

Figure 6:
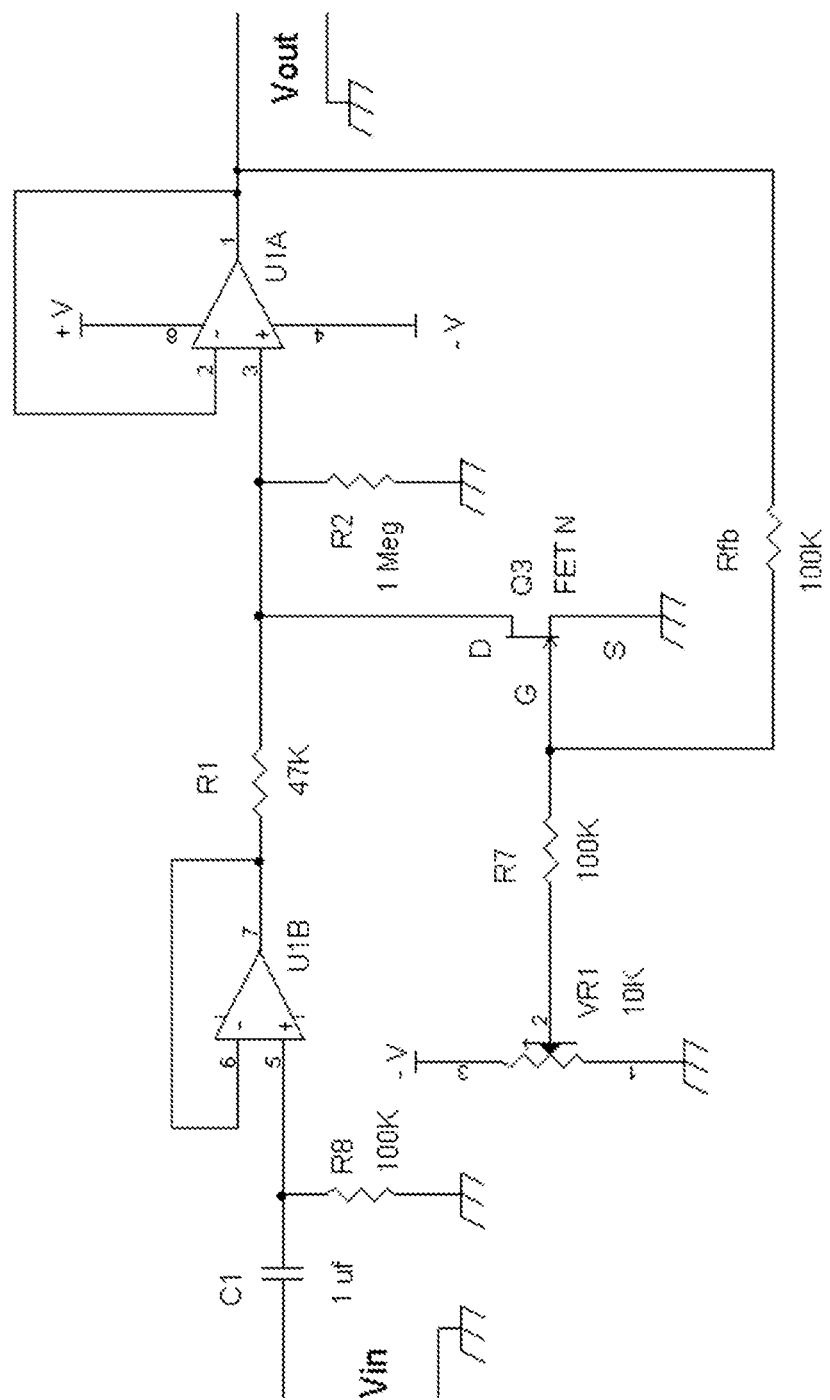
FIG. 6 shows another embodiment circuit using enhancement mode FET or MOSFET as a voltage controlled resistor with improved linearity.

FIG. 6 shows an embodiment for linear voltage control drain to source resistance of Q3, a depletion mode. The advantage of having the amplifier U1A coupled to the feedback network Rfb and R7 to linearize the drain to source resistance of Q3 includes the following:

Inclusion of the amplifier (e.g., U1A) improved the voltage controlled resistor or attenuator circuit in terms of distortion (e.g., voltage controlled resistance wherein the voltage controlled resistance includes improved linearity of resistance as a function of input signal amplitude) and or improvement in prohibiting any portion of the control voltage at R7 (e.g., left side) from leaking or transferring into the drain terminal of the FET (e.g., drain terminal of Q2 the enhancement mode FET) or in prohibiting any portion of the control voltage at R7 (e.g., left side) from leaking or transferring into the output terminal Vout of the circuit in FIG. 6. The addition of a voltage follower amplifier or an amplifier improved by reducing the distortion at the output terminal Vout versus essentially the same circuit with feedback network (e.g., Rfb and F7) shown without an amplifier in FIG. 3. Note because of the amplifier U1A, which is unity gain in this example, the feedback resistor network Rfb and R7 may be lowered in value to overcome parasitic capacitances across the terminals of depletion mode FET Q3 that can affect frequency response. For example, capacitances across the gate and source or drain and gate can affect the (e.g., high) frequency response to the modulation of the drain to source resistance if the control voltage via VR1 is replaced with a modulating signal. The modulating signal may include a DC bias voltage and an AC modulating voltage. Another advantage of having an amplifier such as U1A is that it isolates the feedback resistor network, Rfb and R7, from the drain terminal of Q3 (e.g., and also ground).

It should be noted the feedback network resistors in the circuits of FIG. 3 and FIG. 4 usually include high value resistances such as >500 kΩ to allow for a large range of attenuation from Vin to Vout based on the control voltage to the gate the FET (e.g., Q1 in FIG. 3 or Q2 in FIG. 4). By using an amplifier such as U1A (e.g., voltage follower or gain of substantially 1), the circuits in FIG. 5 and or FIG. 6 can use lower value resistor feedback network (e.g., Rfb and R7) while maintaining greater range of attenuation when compared to the circuits in FIG. 3 or FIG. 4. Note again, the feedback network (e.g., Rfb and R7) provides a more linear drain to source voltage controlled resistance of an FET, wherein the voltage control is coupled to the gate and source of the FET.

The circuit in FIG. 6 at least with an LSK389 or LSK489 depletion mode FET using the feedback network Rfb and R7 and amplifier U1A did have similar low distortion as the circuit in FIG. 3. However, the circuit in FIG. 5 with an SD5000 enhancement mode FET with a feedback network Rfb and R7 and including amplifier U1A had noticeably lower distortion when compared to essentially the same circuit in FIG. 4 that did not include an amplifier (e.g., a voltage follower amplifier, gain of 1 amplifier, or amplifier coupled to the feedback network).

Figure 7A:
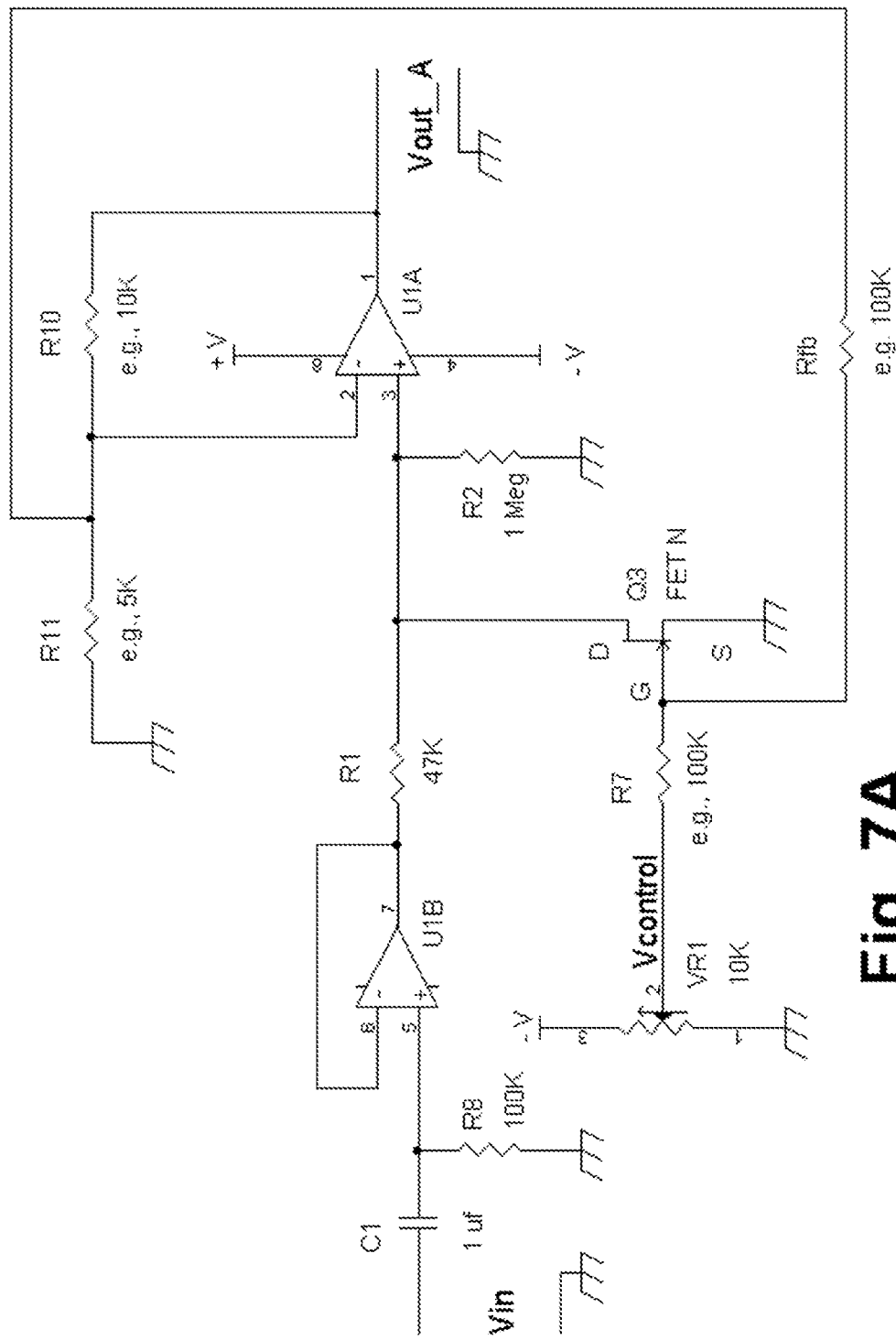
FIG. 7A shows a prior art circuit using an amplifier with >1 voltage gain.

FIG. 7A shows a prior art circuit with a linearized drain to source voltage controlled resistance via Rib and R7 with an amplifier U1A that has a gain of >1. In this circuit, the amplifier U1A allows for feed-through from the control voltage, Vcontrol, via the slider or wiper of VR1, to appear at the output terminal Vout as: −Vcontrol[R10/(Rfb+R7)]. For example, if R10=10 kΩ and Rfb=100 kΩ and R7=100 kΩ, then Vout will include −Vcontrol[10 k/(100 k+100 k)]=−(10/200) Vcontrol=−0.05 Vcontrol. Whereas in the circuits in FIG. 5 and FIG. 6 do not include any portion of Vcontrol or control voltage at their output terminals.

Figure 7B:
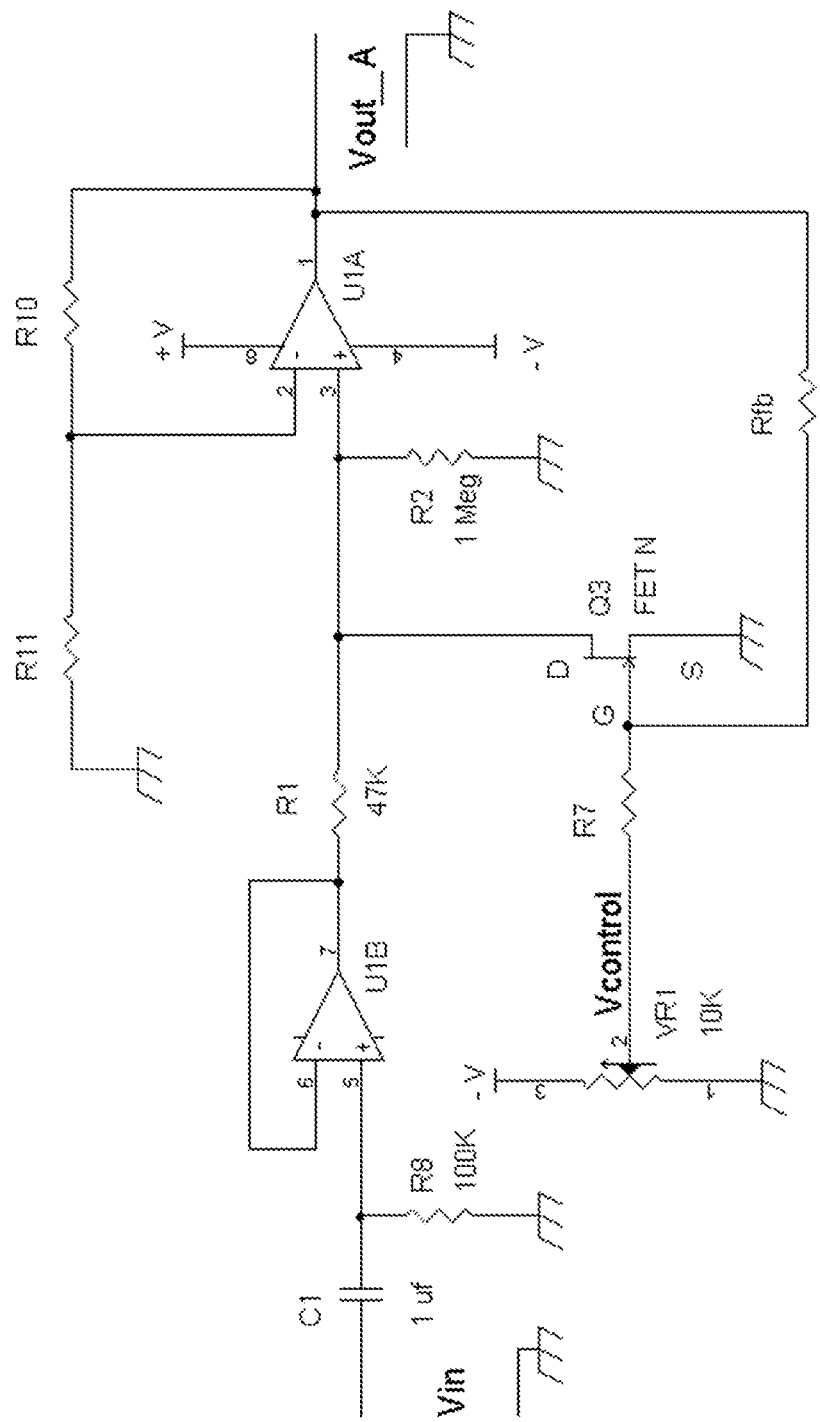
FIG. 7B shows an embodiment circuit that improves on the circuit shown in FIG. 7A.

With a slight change in the circuit of FIG. 7A, by re-routing Rfb, and changing its value, a linearized drain to source voltage controlled resistance is provided while prohibiting any portion of Vcontrol to pass (e.g., leak through) to the output terminal Vout via FIG. 7B.

In FIG. 7B, amplifier U1A has a gain, G=[(R10+R11)/(R11)]=1+(R10/R11). The drain voltage is amplified by a factor of G at Vout_A. To provide for a linearized drain to source voltage control resistance, 50% of the drain voltage of Q3 should be coupled to the gate of Q3. The resistor values of Rib and R7 are chosen such that: G[(R7)/(R7+RN]=½. Or in other words, [(R7+Rfb)/(R7)]=2G, which equivalently states that (Rfb/R7)=2G −1. For example if G=10 (e.g., R10/R11=9, such as R10=18 kΩ and R11=2 kΩ), then (Rfb/R7)=2×10−1=20−1=19 or (Rfb/R7)=19, which can have example values of: Rfb=1900 kΩ (1.9 MΩ) and R7=100 kΩ. One other advantage to having R7<<Rfb due to G>1 is that the control voltage is almost completely coupled to the gate terminal of the FET Q3 (e.g., 1−1/(2G); for example if G=10, the transferred voltage is 1−1/(2G)= 1−1/(2×10)=1−0.05=95% transferred to the gate of the FET, Q3.

In the FIGS. 3, 4, 5, 6, and 7A, the control voltage from the wiper or slider of VR1 is transferred to the gate at half or 50%. This results in that to provide a full range of attenuation, twice the voltage is required at the wiper of VR1. FIG. 7B with G>1 allows for less than twice the voltage at the wiper of VR1 to provide a full range of attenuation from the voltage controlled resistor FET.

Figure 8:
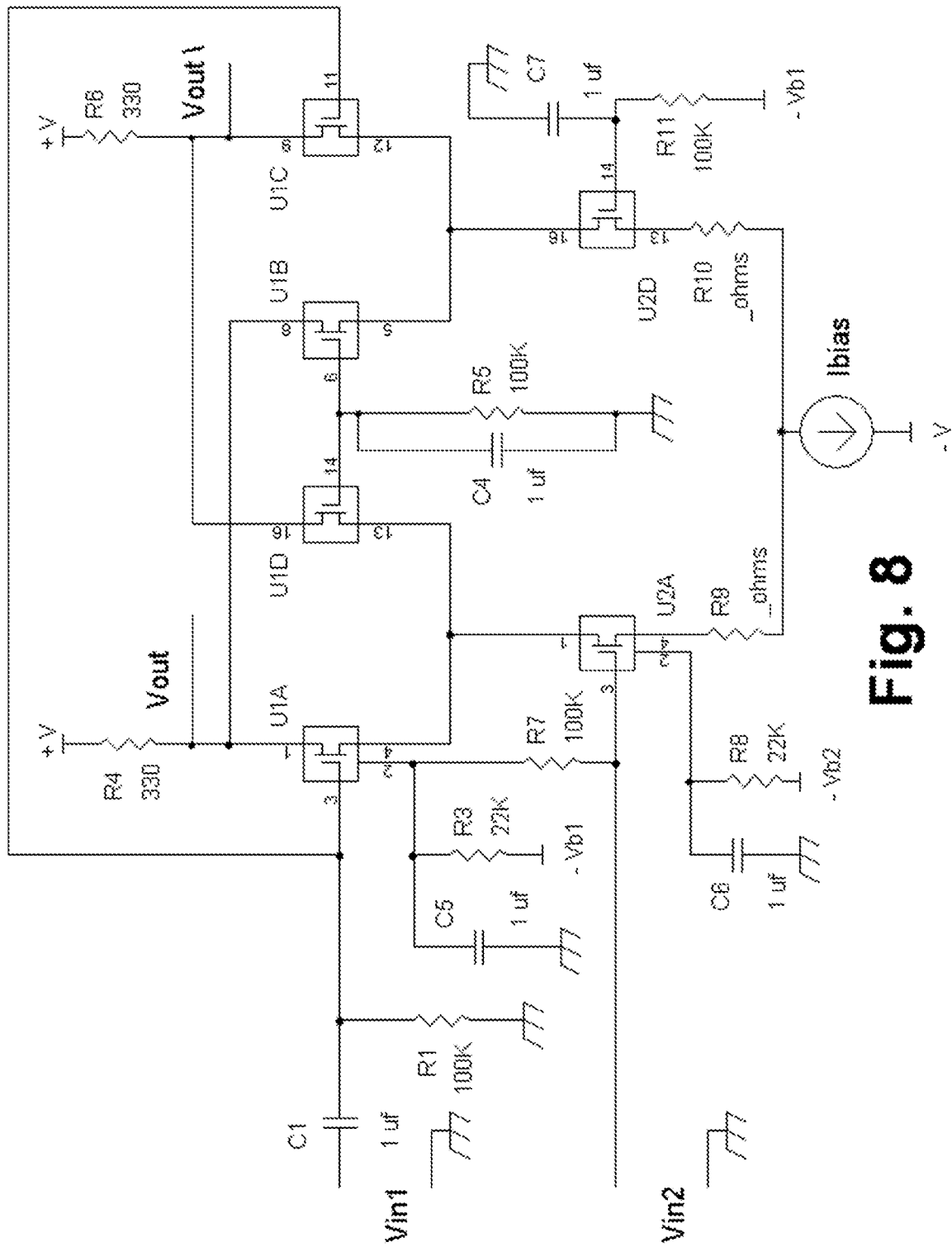
FIG. 8 shows an embodiment using an example Field Effect Transistors to provide a triangle wave from a sine wave input signal.

FIG. 8 shows an FET four quadrant multiplier circuit that is found to have new use that includes a sinewave to triangle wave processing method or a sinewave to triangle wave apparatus or a sinewave to triangle wave circuit. That is, the circuit in FIG. 8 includes a sine wave to triangle wave converter. A first differential amplifier comprising of U1A and U1D has either its input terminals or output terminals cross coupled with a second differential amplifier comprising U1B and U1C. The source terminals of U1A and U1D are coupled and further coupled to a first current signal via U2A. The source terminals of U1B and U1C are coupled and further coupled to a current signal via U2D. A first signal (e.g., Vin1) terminal is coupled to the gate terminals of U1A and U1C while the gate terminals of U1B and U1D are coupled to a second signal terminal (e.g., ground or inverting phase first signal). The source terminals of U1B and U1C are coupled and further coupled to a second signal current via U2D. The first signal current via the drain of U2A comprises a DC current, DCQ, and a Vin2 AC signal current. The second signal current via the drain of U2D comprises substantially the same DC current as DCQ with an inverted phase Vin2 AC signal current. The drain terminals of U1A and U1B are coupled together and provide an output terminal Vout; the drain terminals of U1C and U1D are coupled together and provide an output terminal Vout\. Although load resistors R4 and R6 have example resistance values of 330Ω each, other resistance values may be used. The load resistors R4 and or R6 may be substituted by coupling the drains of the FET that were coupled to R4 and R6 to the input terminals of grounded gate amplifiers or to the input terminals of grounded base amplifiers or to the input terminals of transresistance amplifiers. With a sine wave signal included to Vin1 and a signal included into Vin2, signal output from Vout or Vout includes a triangle waveform. Vin2 may be a voltage close to the voltage of −vb1. R9 and R10 are optional source degeneration or local feedback resistors for U2A and U2D, which provides a more linear transfer function for (e.g., a third) differential amplifier U2A and U2D. DC biasing for all FETs is provided by current source Ibias. Although in FIG. 8, insulated gate, MOS, or enhancement mode FETs are shown, depletion mode or JFETs (Junction Field Effect Transistor) may be used. Yet alternatively, bipolar transistors with series emitter degeneration resistors (e.g., in the locations of U1A, U1B, U1C, and U1D) may also provide sine wave to triangle wave conversion. FIG. 8 can provide a mixer or multiplier function with a modulated (e.g., with Vin2 included for a modulating signal) triangle waveform output for a sinewave input (e.g., sine wave signal at Vin1). Sinewave signal at Vin1 can be included as a carrier signal. If Vin2 is a DC signal, the output of the circuit at Vout or Vout provides a triangle waveform when Vin1 includes a sine wave signal.

Figure 9:
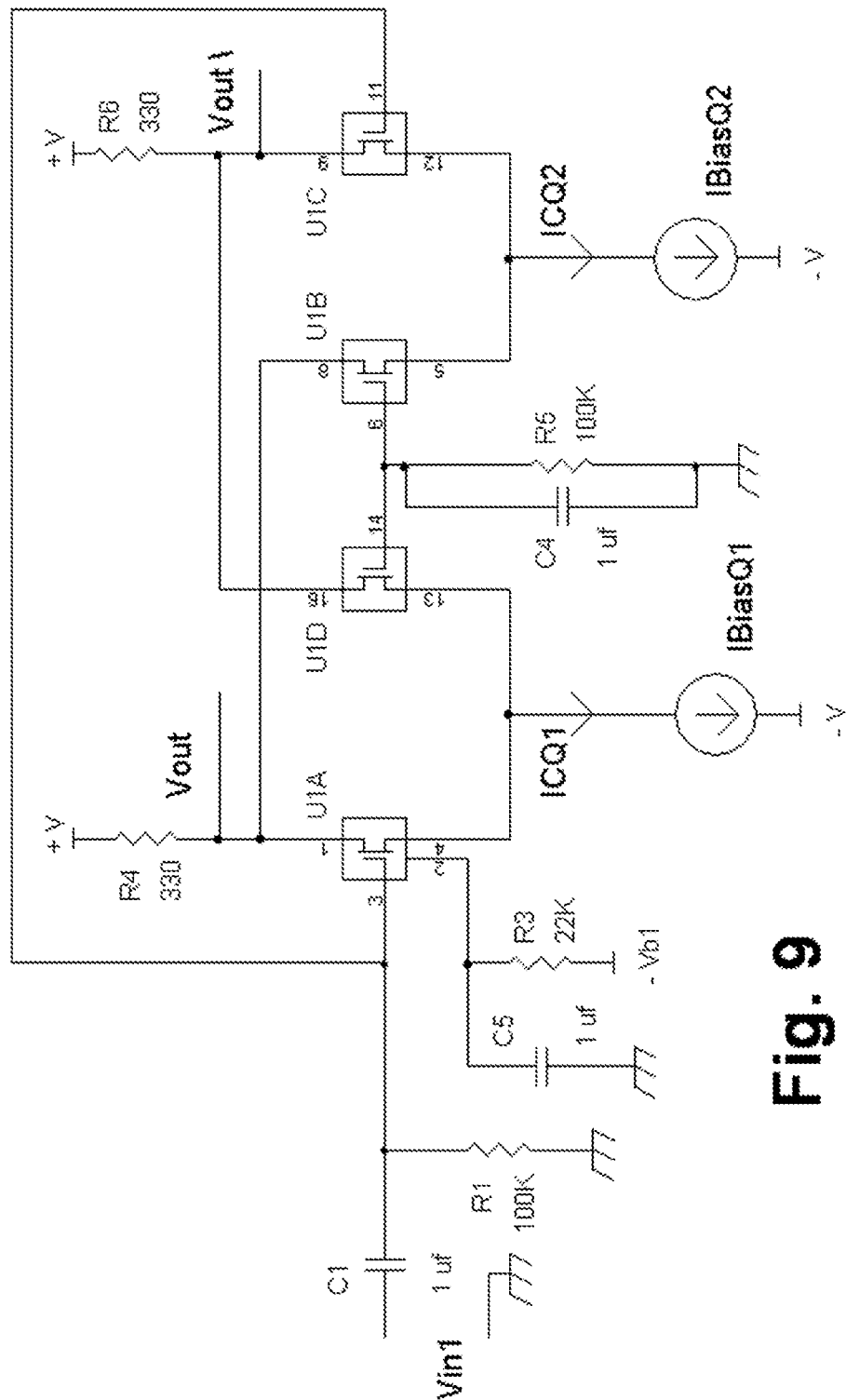
FIG. 9 shows another embodiment of a sine wave to triangle wave converter circuit example.

FIG. 9 shows a sine to triangle wave converter circuit. Field Effect Transistors U1A, U1B, U1C, and U1D are similarly connected as described for FIG. 8. The source terminals of U1A and U1D are coupled together and further coupled to a current source IBiasQ1 denoted by ICQ1. The source terminals of U1B and U1C are coupled together and further coupled to a current source IBiasQ2 denoted by ICQ2. Sine wave to triangle wave conversion is provided by coupling a sine wave signal for Vin1 and having unequal currents for IBiasQ1 and IBiasQ (e.g., ICQ1≠ICQ2 or IBiasQ1≠IBiasQ2). An output signal is provided via Vout or Vout.

Alternatively in FIG. 9, two resistors may be substituted for current sources IBiasQ1 and IBiasQ2 to provide sine wave to triangle wave conversion. Preferably the current flowing through these two resistors is not equal. In FIG. 9, the FETs U1A, U1B, U1C, and U1D may be substituted with depletion mode devices, or bipolar transistors with series emitter resistors (e.g., series emitter degeneration resistors).

Note that the circuits in FIG. 8 and FIG. 9 are not the same as a triangle wave to sine wave converter, where the input signal is a triangle wave (e.g., instead of a sine wave signal) and the output signal is a sine wave (e.g., instead of a triangle waveform).

Figure 10:
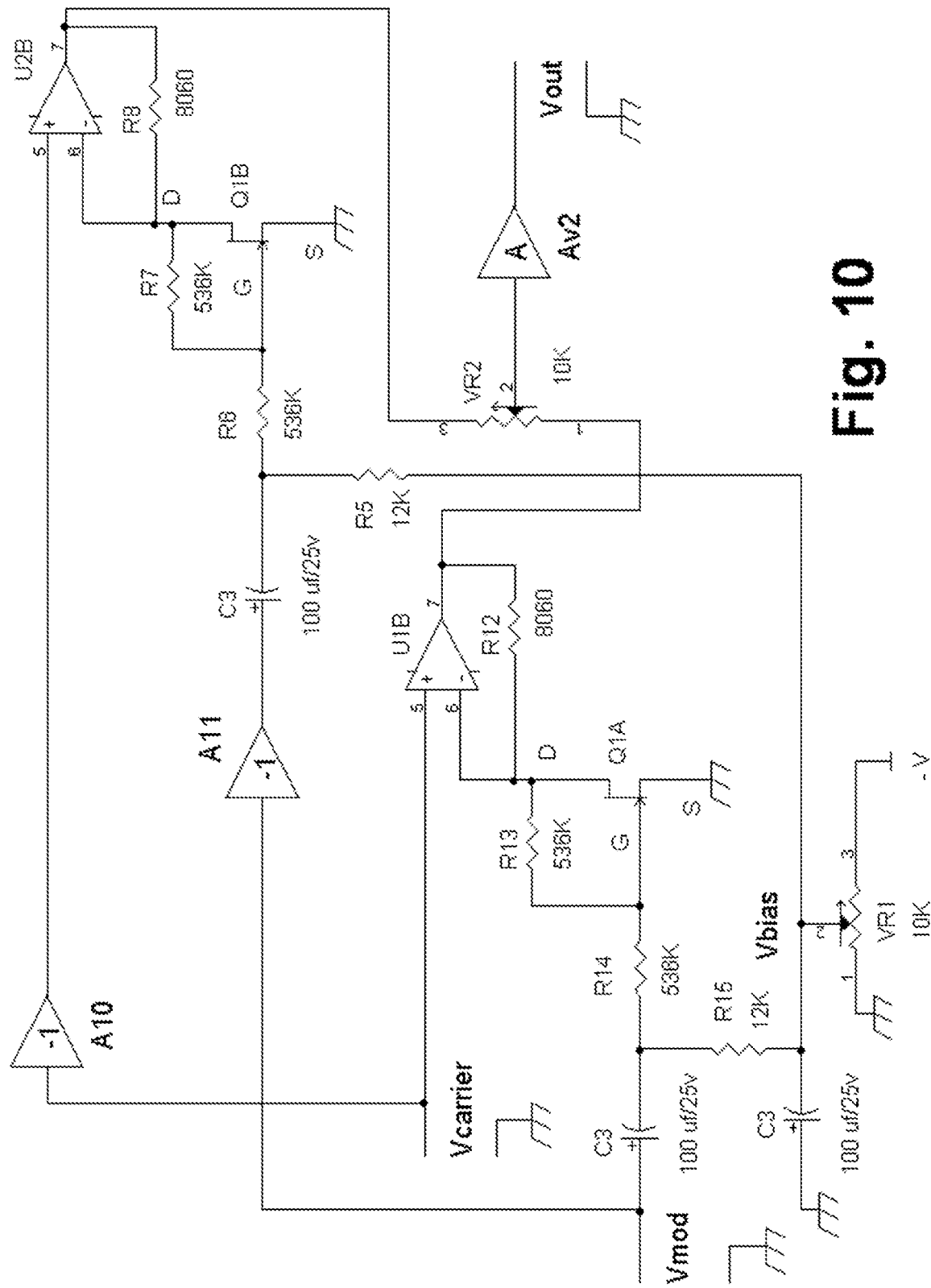
FIG. 10 shows an embodiment of an FET modulator using feedback elements for lower distortion.

FIG. 10 shows a multiplier circuit using linearized drain to source voltage controlled resistance via FETs Q1A and Q1B. The linearization networks comprise of R13 and R14 for Q1A, and R7 and R6 for Q1B. The voltage gain of amplifier U1B is approximately [(R12/$R_{dsQ1A'}$)+1], and the voltage gain of amplifier U2B is approximately [(R8/$R_{dsQ1B'}$)+1]. $R_{dsQ1A'}$ is the equivalent drain resistance from the drain terminal of Q1A to ground that may include an effect from the feedback network resistors R13 and R14. $R_{dsQ1B'}$ is the equivalent drain resistance from the drain terminal of Q1B to ground that may include an effect from the feedback network resistors R7 and R6. In FIG. 10 the multiplier comprises two standard AM (amplitude modulation) circuits wherein the first AM circuit (e.g., U1B) is coupled to an in-phase carrier signal (e.g., Vcarrier) and to an in-phase modulation signal (e.g., Vmod). The second AM circuit (e.g., U2B) is coupled to an inverted phase carrier signal via A10 and to an inverted phase modulation signal via A11. In phase and out of phase modulation signals are coupled to the voltage controlled resistor circuits Q1A and Q1B respectively. Each AM circuit provides a two quadrant multiplying effect. The output of the two AM circuits U1B and U2B are summed to potentiometer VR2 to provide a four quadrant multiplying effect. There is a balance control via VR2 to ensure closest performance to a 4 quadrant multiplier, and the output signal, Vout, is provided by amplifier Av2. Bias voltage Vbias sets an initial or nominal drain to source resistance for Q1A and Q1B. Alternatively in FIG. 10 that shows JFETs, other types of FETs can be used in place of Q1A and Q1B such as enhancement mode or MOS field effect transistors. VR2 is for exampled adjusted to minimize the carrier signal at the output terminal such as Vout.

Figure 11:
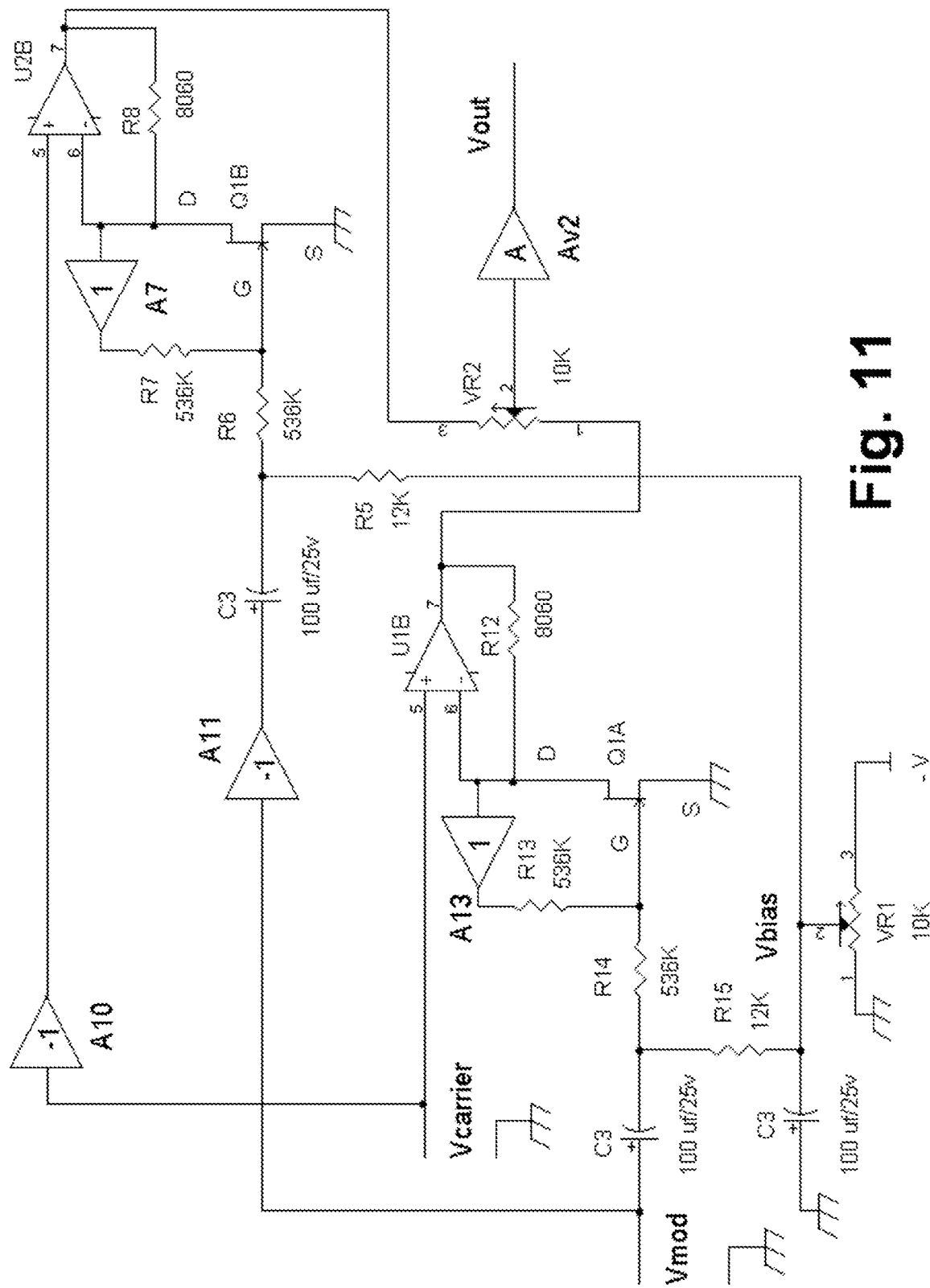
FIG. 11 shows an embodiment of an FET modulator with improve linearity and or performance (e.g., less leakthrough of an input signal (e.g., modulation signal or Vmod) to an output terminal).

FIG. 11 shows an improved multiplier circuit from FIG. 10 by including amplifiers A13 and A7 to isolate the feedback resistors R13 and R7 from transferring any portion of the modulation signal or inverted modulation signal to the output of the multiplier circuit of FIG. 11. Multiplier linearity with JFETs or depletion mode FETs is improved by including amplifiers A13 that drives feedback resistor R13, and (amplifier) A7 that drives feedback resistor R7. Multiplier linearity improvement is provided more so by including amplifiers A13 that drives feedback resistor R13, and (amplifier) A7 that drives feedback resistor R7 when the FETs (e.g., Q1A and Q1B) are enhancement mode FETs or MOSFETs (e.g., when compared to using enhancement mode devices in FIG. 10 with bias −v→+v for a positive bias voltage, Vbias). Note with N Channel enhancement mode FETs, Vbias should be a positive voltage, that results in the voltage source −v→+v coupled to VR1.

Figure 12:
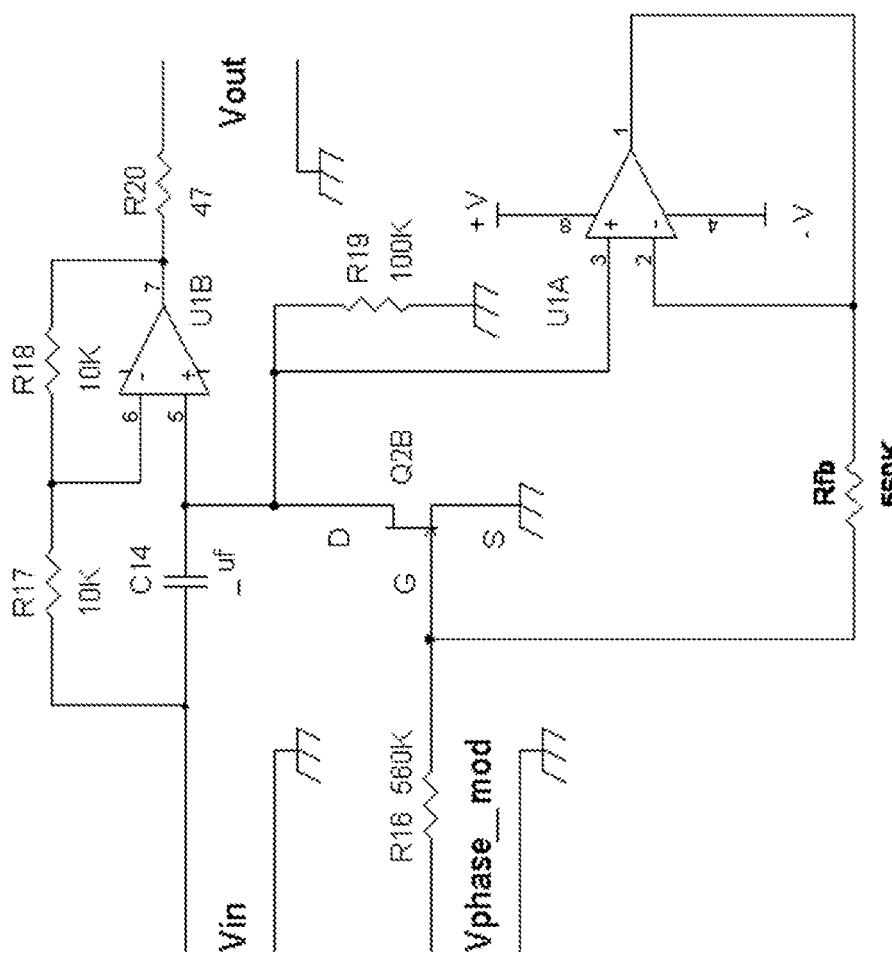
FIG. 12 shows an embodiment for a voltage controlled phase shifter.

FIG. 12 shows a voltage controlled phase shifting circuit via U1B with linearized drain to source Q2B FET resistance (e.g., via feedback network Rfb and R16). A buffer amplifier U1A is included to avoid or to prohibit leaking the phase modulation or phase shifting signal (e.g., Vphase_mod may include an AC and or DC signal(s)) into the output terminal Vout. The phase shift is related to the time constant of C14×$R_{dsQ2B}$||R19, where $R_{dsQ2B}$ is the drain to source resistance of FET Q2B, and where $R_{dsQ2B}$||R19=[($R_{dsQ2B}$×R19)/($R_{dsQ2B}$+R19)]. In this example of FIG. 11, the phase shift=180 degrees—2 arctan(f/$f_c$). Where f=frequency from the Vin signal source, and $f_c$=1/[2π(C14×$R_{dsQ2B}$||R19)]. In some circuits R19 may be omitted such that R19=infinite ohms. Although Q2B in FIG. 12 is shown as a JFET or depletion mode FET, Q2B may include an enhancement mode FET or MOSFET as shown in FIG. 13.

Figure 13:
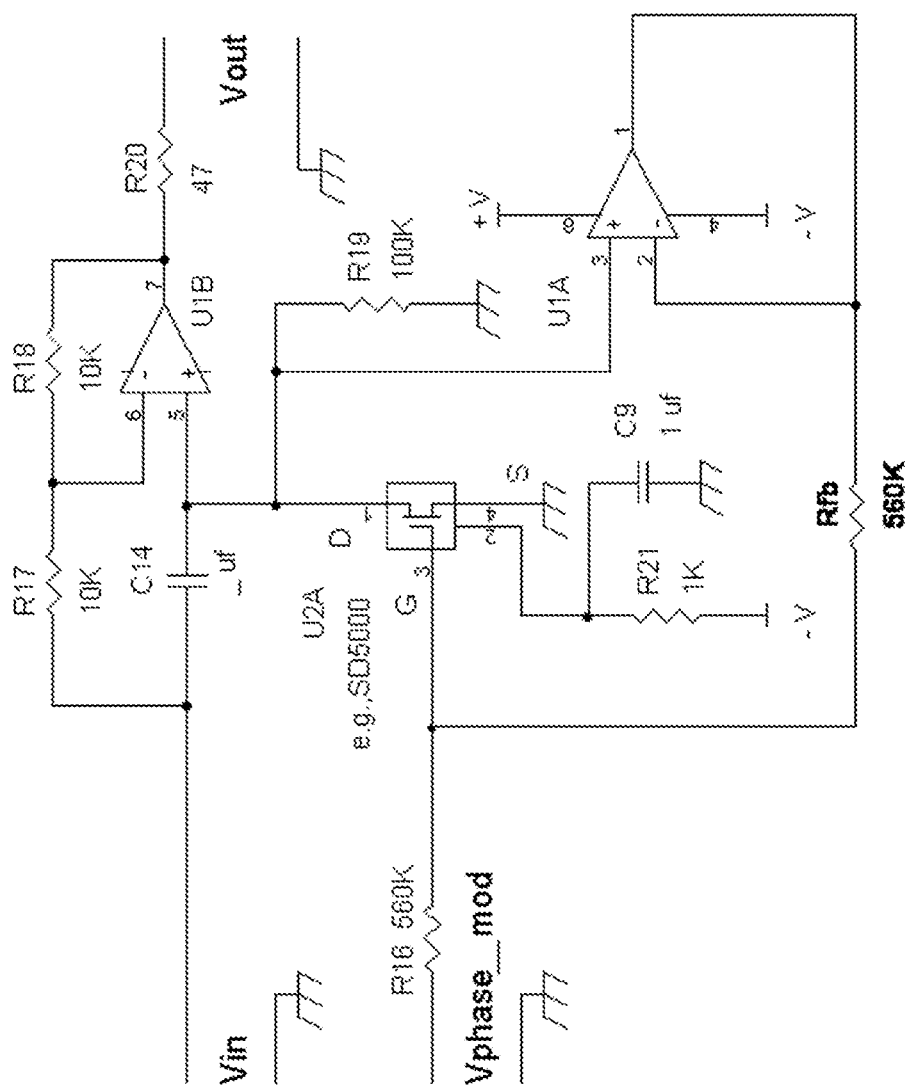
FIG. 13 shows an embodiment for a voltage controlled phase shifter using an enhancement FET or MOSFET with improved linearity or with lower distortion.

FIG. 13 shows another embodiment of a phase shifting circuit. The input signal Vin is phase shifted via a control voltage, Vphase_mod. In this example, an enhancement mode FET, U2A, is included. An amplifier U1A provides coupling signal from the drain of the FET, U2A, to a feedback resistor network Rfb and R16 to minimize non-linear drain to source resistance of U2A. As mentioned previously, using an amplifier or buffer amplifier such as U1A lowers the harmonic distortion caused by the drain to source resistance of U2A. In some examples when the enhancement mode FET (e.g., U2A) includes an SD5000 device, distortion was dramatically reduced by using a voltage follower amplifier to drive the feedback resistor Rfb compared to when the feedback resistor R7 was connected to the drain of U2A. The phase at Vout referenced to Vin is shifted in the following manner: 180 degrees−2 arctan(f/f$_c$). Where f=frequency from the Vin signal source, and f$_c$=1/ [2π(C14×R$_{dsU2A}$∥R19)]. Where R$_{dsU2A}$ is the drain to source resistance of FET U2A, and where R$_{dsU2A}$∥R19=[(R$_{dsu2A}$× R19)/(R$_{dsU2A}$ R19)]. In some circuits R19 may be omitted such that R19=infinite ohms.

Figure 14:
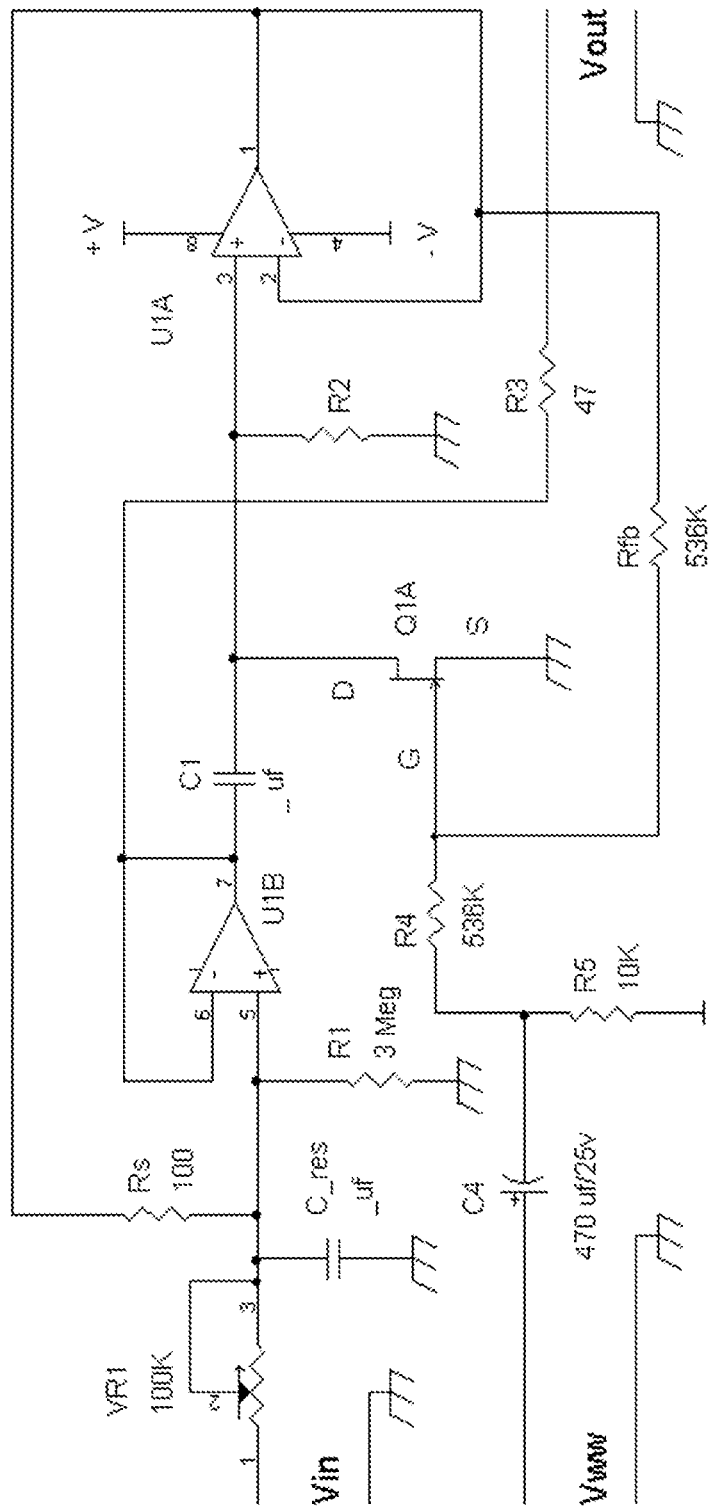
FIG. 14 shows an embodiment example of a voltage controlled inductor or voltage controlled gyrator with improved linearity.

FIG. 14 shows another embodiment where a linearized voltage controlled resistor (e.g., via feedback network Rfb and R4) is included to provide a voltage controlled gyrator (e.g., simulated inductor) circuit via the drain to source resistance of FET Q1A, C1, U1A, and Rs. The gyrator equivalently provides an inductor in parallel to C_res. The gyrator's inductance L=RsC1R$_{dsQ1A}$ with a series resistance of Rs. R$_{dsQ1A}$ is the drain to source resistance of FET Q1A that is controlled by −Vbias and or Vww. The gyrator can be modeled as an ideal inductor of L in series with a resistor Rs (e.g., L+Rs). With C_res in parallel with the gyrator, a parallel inductor-capacitor band pass filter circuit is provided. This parallel inductor-capacitor band pass circuit may be coupled to a current source or may be coupled to a driving resistor, VR1 as shown in FIG. 14. The quality factor of the bandpass filter circuit is: Q~2πf$_{res}$ (VR1)(C_res), where Rs is sufficiently small in resistance to provide an unloaded Q$_u$>Q.

In FIG. 14 the FET Q1A may be replaced with an enhancement mode (e.g., N-channel) FET providing that −Vbias→+Vbias. The output amplifier U1B provides the band pass filtered signal to a load without affecting the Q of the parallel capacitor gyrator (e.g., gyrator is a simulated inductor) bandpass filter circuit. Amplifier U1A provides isolation from the Vww or the DC bias voltage, −Vbias for depletion mode N channel FET (e.g., for Q1A) or having +Vbias for enhancement mode N Channel FET (e.g., for Q1A). Amplifier U1A also provides improved distortion reduction when enhancement mode FETs are included (e.g., as Q1A).

Figure 15:
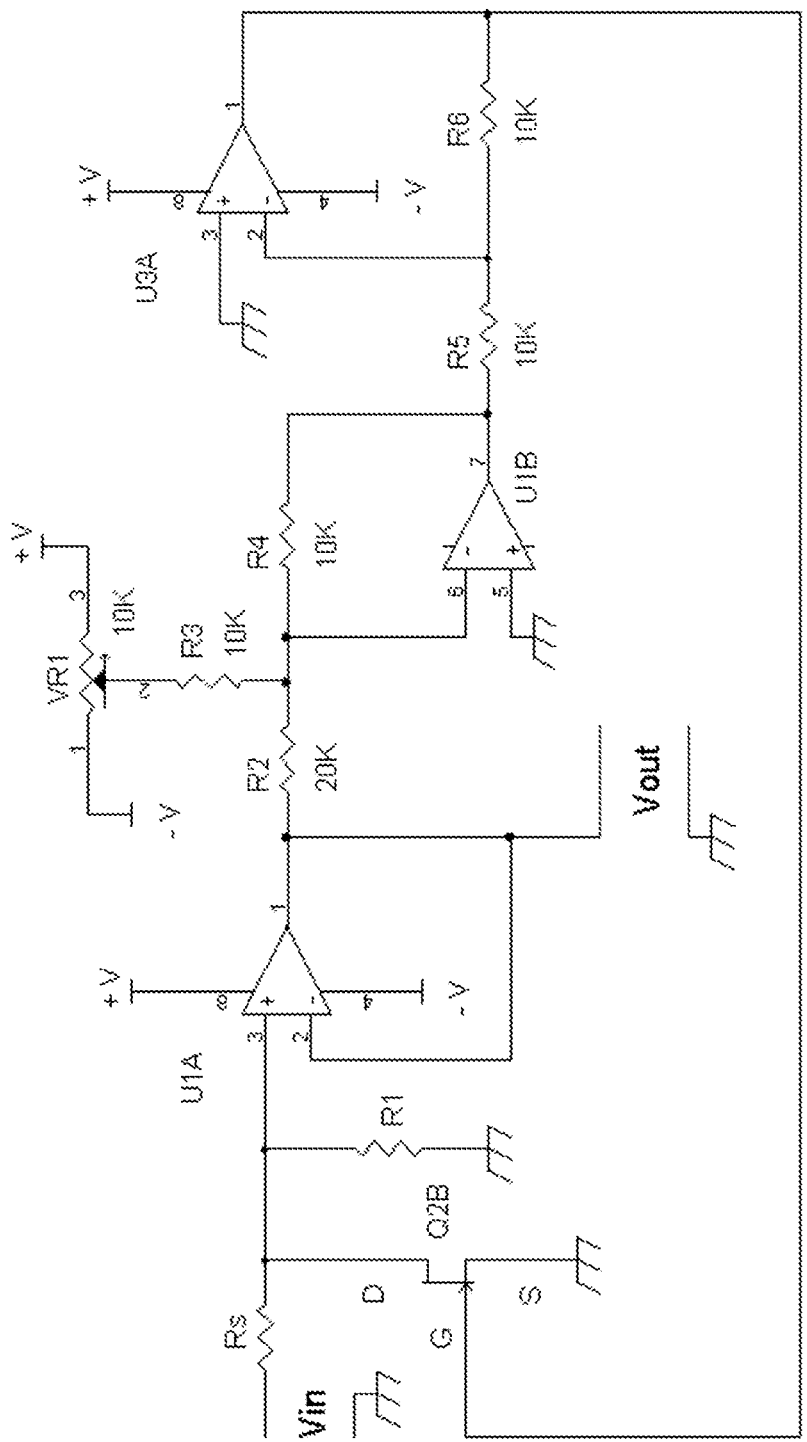
FIG. 15 shows an embodiment of a bias circuit for a voltage controlled resistor.

FIG. 15 shows an embodiment method and apparatus to provide feedback that lowers nonlinear resistor distortion of the drain to source resistance of the FET (e.g., Q2B) via amplifiers with a net gain of 0.5 from the drain to gate of the FET. FIG. 15 also prevents the control voltage from VR1 from leaking or passing to the output terminal Vout. An input signal Vin is coupled via a resistor Rs and the drain to source resistance of Q2B form a voltage divider in parallel with R1. R1 may be removed optionally.

In the circuit shown in FIG. 15, the circuit provides a smaller control voltage from VR1 compared to circuit such as shown in FIGS. 3, 4, 5, and 6 that attenuates (via the feedback network) the control voltage by 50% to the gate of the FET. Because of this 50% attenuation of the control voltage to the gate terminal, the circuits shown in FIG. 3, 4, 5, and or 6 for example require twice the voltage than control voltages for FIGS. 1 and 2 for the same attenuation range. The amplifier circuit in FIG. 15 includes an amplifier U1B that allows the control voltage from VR1 to be transferred without attenuation to the gate of the FET.

Figure 16:
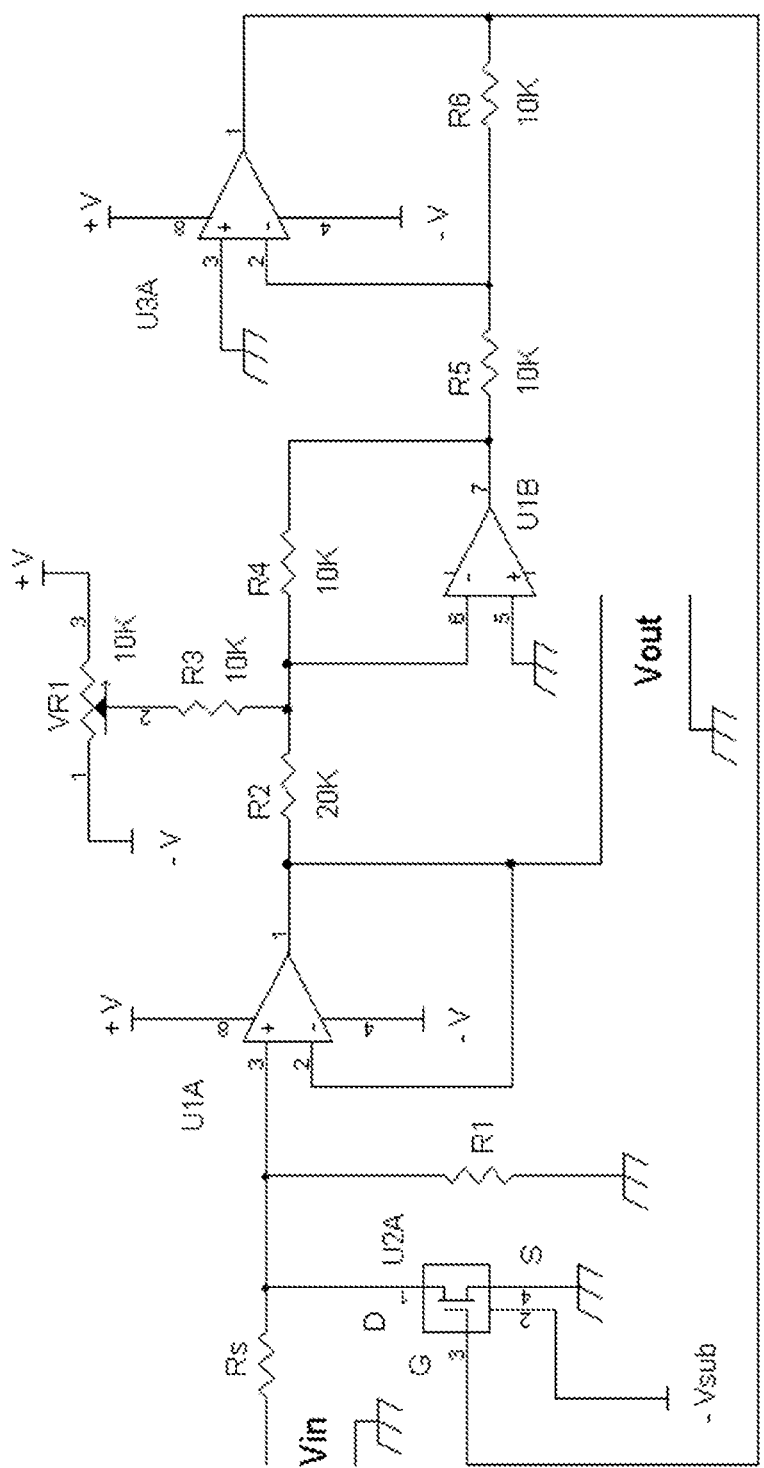
FIG. 16 shows another embodiment of a bias circuit for a voltage controlled resistor.

Alternatively in FIG. 15, the resistor R3 may be smaller in resistance value such that the control voltage (e.g., at the slider or wiper of VR1) is amplified with a gain >1 via U1B and U3A (e.g., gain=R4/R3) and transferred or coupled to the gate of the FET (e.g., Q2B). This greater than 1 gain of the control voltage allows for a smaller voltage for the control voltage (e.g., at the wiper or slider of VR1) when compared to the circuits in FIG. 1, 2, 3, 4, 5, and or 6. FIG. 15 includes a JFET or depletion mode device (e.g., Q2B). FIG. 16 shows essentially the same circuit as FIG. 15 that includes an enhancement mode FET or MOSFET (e.g., U2A) instead of a depletion mode FET or JFET.

Figure 17:
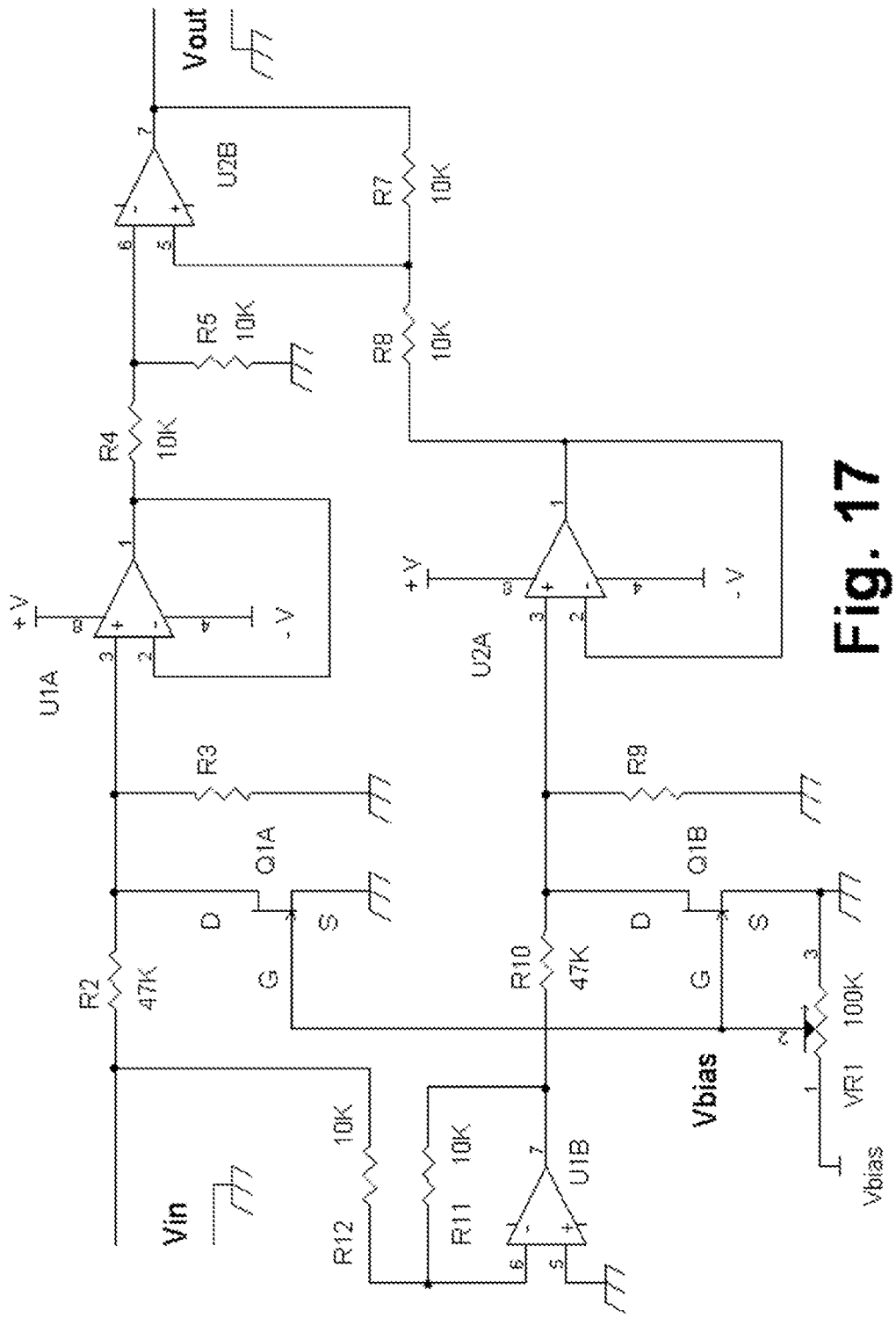
FIG. 17 shows an embodiment, a push-pull voltage controlled resistor circuit for increased linearity.

FIG. 17 shows an embodiment for reducing at least one even order harmonic or intermodulation distortion via driving two FET voltage controlled resistors in balanced or push pull mode. The signals from the drain terminals of the two FET voltage controlled resistors are subtracted via a differential amplifier (e.g. U2B) that cancels or reduces even order harmonic distortion, and or that cancels or reduces even order intermodulation distortion. A push pull or balanced signal is provided by an in-phase signal coupled to a first FET Q1A and an out of phase signal (e.g., inverted phase signal) provided by inverting amplifier circuit R12, R11, and U1B. The out of phase signal from U1B is coupled to a second FET Q1B. Vbias supplies a negative bias voltage to control the drain to source resistances of FETs Q1A and Q1B. Preferably Q1A and Q1B are matched.

Figure 18:
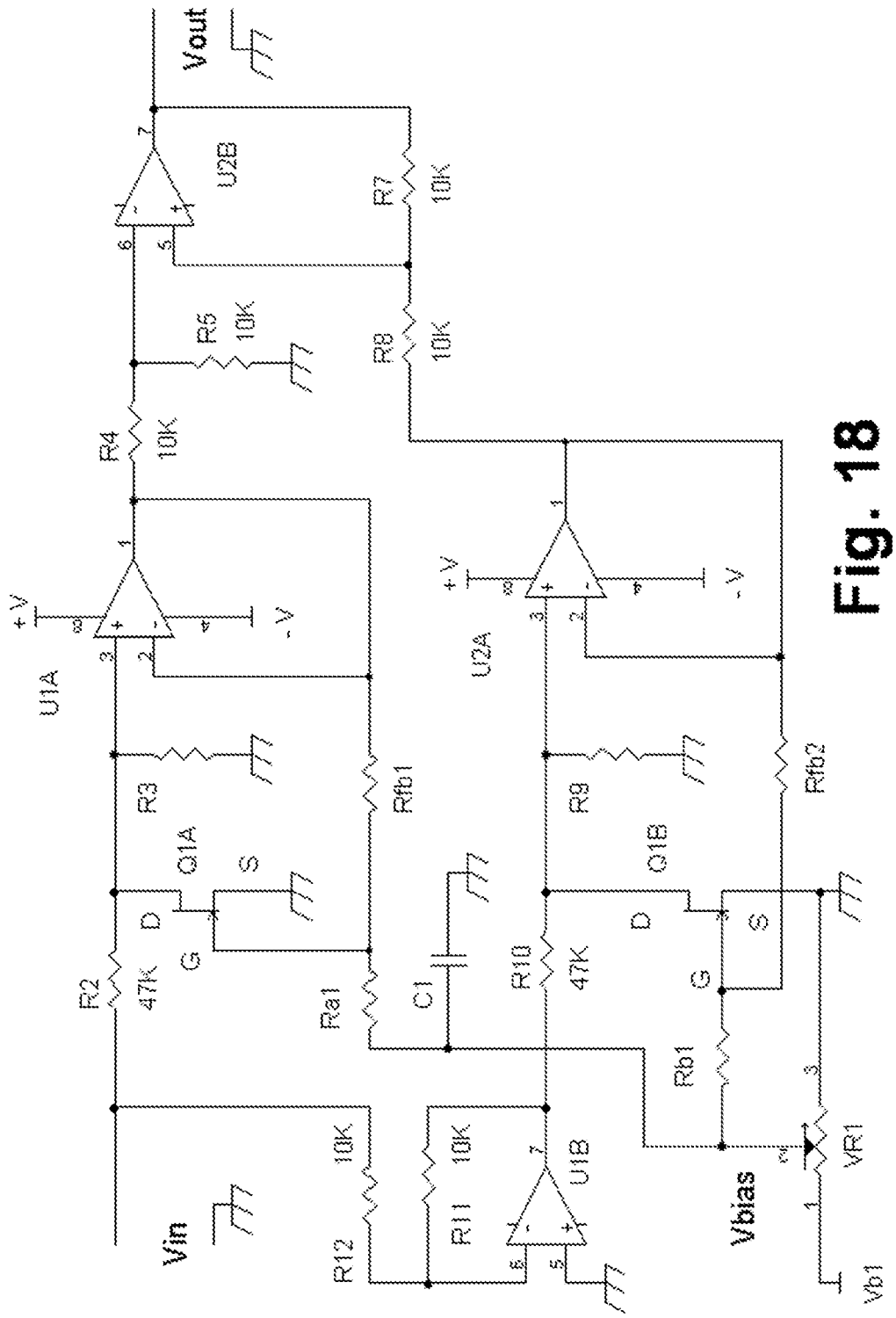
FIG. 18 shows an embodiment, a push-pull voltage controlled resistor circuit with feedback for increased linearity.

FIG. 18 shows another embodiment with further improvement wherein the FET circuits include feedback linearization (e.g., reduction of distortion) from the drain to source resistances of Q1A and Q1B via amplifiers and feedback networks. A first FET (e.g., Q1A) is supplied with an in-phase input signal Vin; a second FET (e.g., Q1B) is supplied with an out of phase (e.g., inverted phase) input signal via the output of U1B. Each FET includes a distortion reduction circuit via U1A, Rfb1, and Ral for Q1A, and a distortion reduction circuit via U2A, Rfb2, and Rb1 for Q1B. The signals from the drains of Q1A and Q1B are coupled via U1A and U2A to a differential amplifier U2B to further subtract or cancel even order distortion. The output signal is coupled to an output terminal of U2B. A bias voltage to the FET is provided by VR1, which is a negative voltage for N channel depletion mode FETs or N channel JFETs. Preferably Q1A and Q1B are matched.

Figure 19:
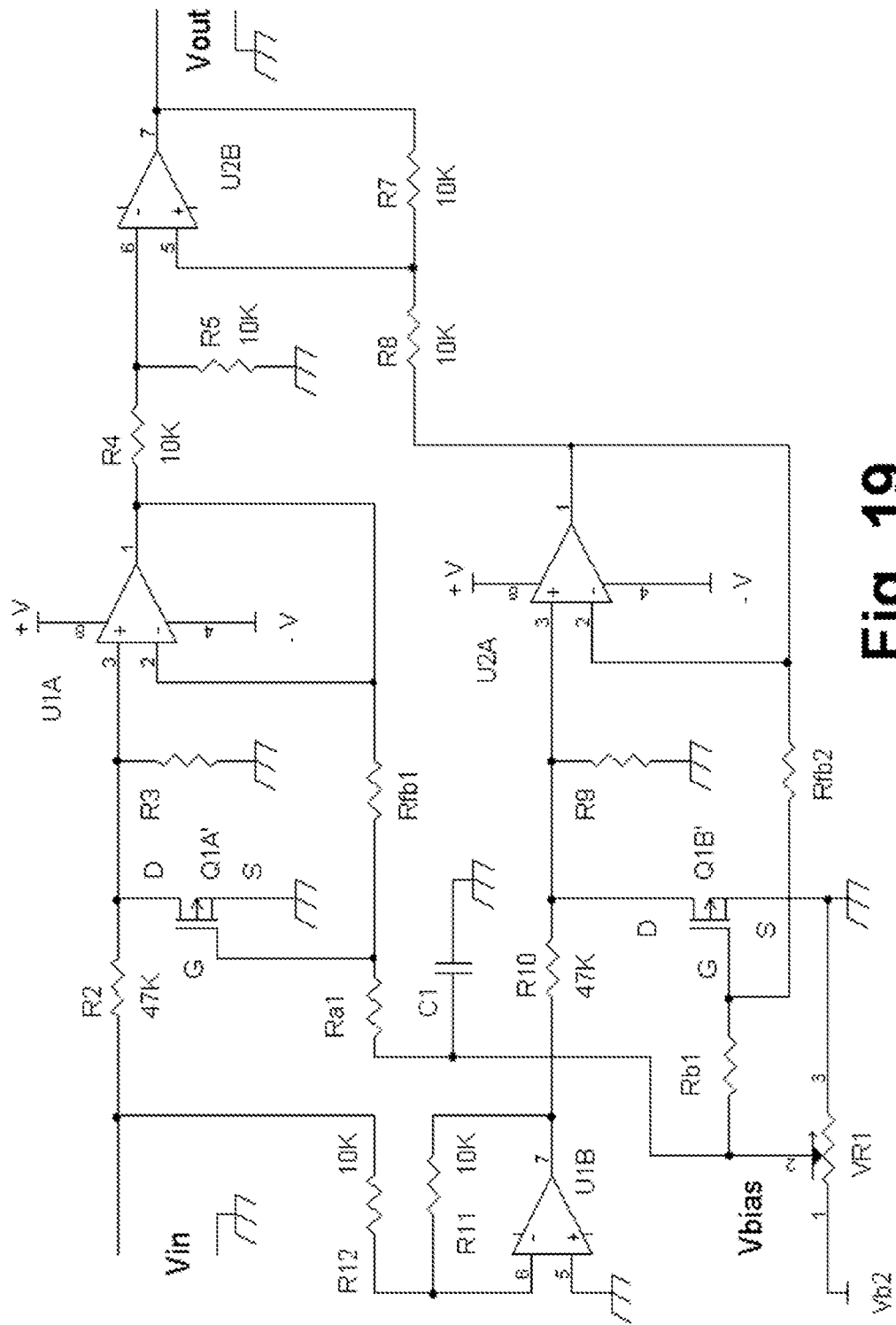
FIG. 19 shows another embodiment, a push-pull voltage controlled resistor circuit with feedback for increased linearity using at least one enhancement mode FET or MOSFET.

If Q1*a* and Q1B are N channel enhancement mode or N channel MOSFETs, then the bias voltage Vbias will include a positive voltage as shown in FIG. 19. FIG. 19 shows an example circuit using enhancement mode devices (FETs) that perform essentially the same functions as the circuit in FIG. 18. Note in FIG. 19 that the isolation amplifiers or buffer amplifiers U1A coupled to Rfb1 to the gate of FET Q1A'; and U2A coupled to Rfb2 to the gate of FET Q1B' provides lower distortion characteristics than if the feedback resistors Rfb1 were connected across the drain and gate of Q1A' and Rfb2 were connected across the drain and gate of Q1B'. Preferably Q1A' and Q1B' are matched.

Figure 20:
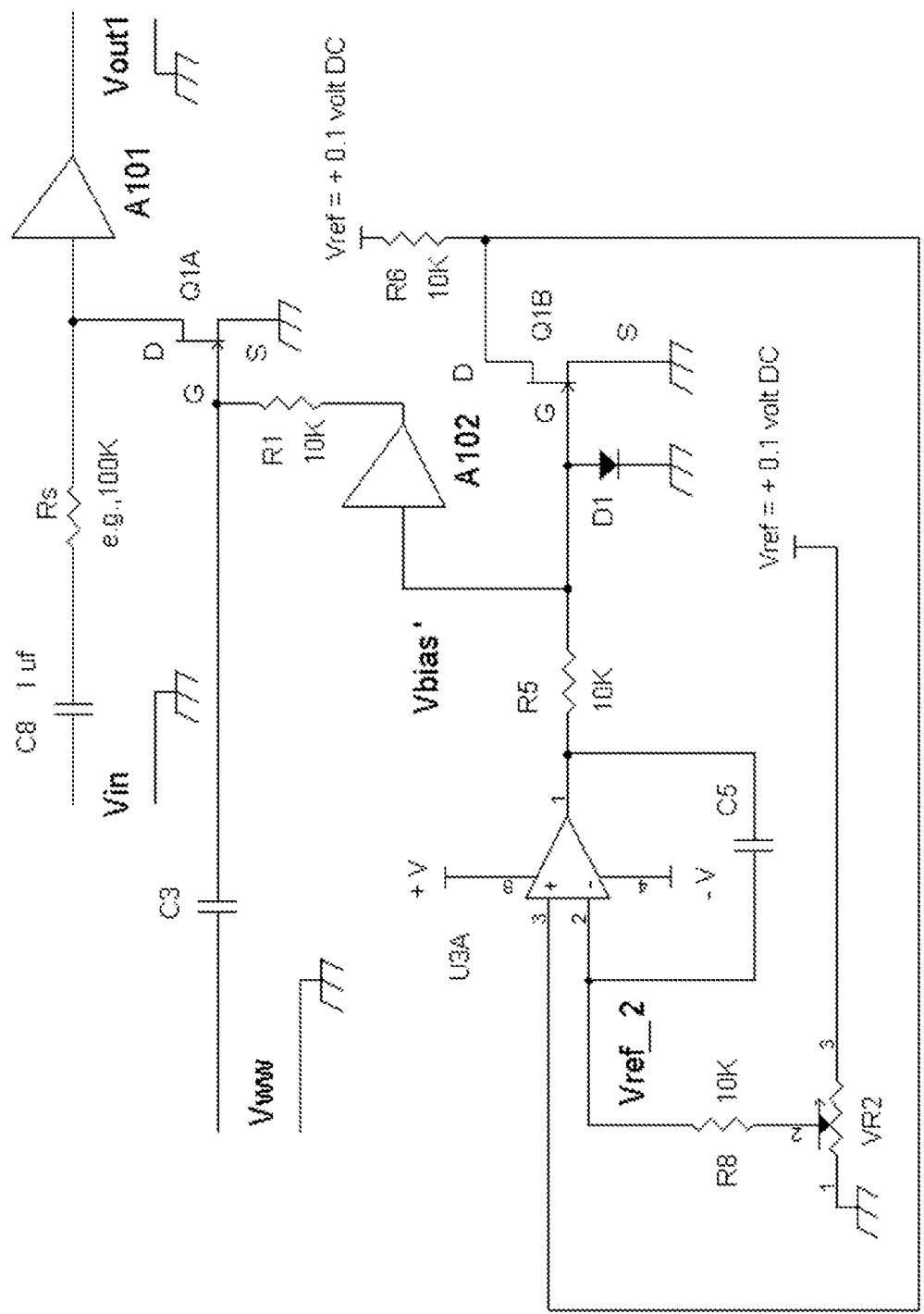
FIG. 20 shows an example embodiment of an automatic bias circuit for providing one or more pre-determined voltage controlled resistance.

FIG. 20 shows a bias servo system to automatically adjusting an FET to a predetermined drain to source resistance. In this example circuit, a reference FET, Q1B, is operating in the ohmic or triode region (e.g., not in the current source region nor in the FET's saturation region). A reference voltage, Vref, such as 0.1 volt DC (although other reference voltages may be used) is coupled to a load resistor R6, which by example is 10KΩ in this circuit but other values of R6 may be used. The reference voltage is coupled to VR2, which can be adjusted to bias Q1B to a predetermined drain to source resistance. VR2's wiper or slider terminal couples a voltage Vref_2 to the (−) input of amplifier U3A, which by negative feedback forces the (+) input to the same voltage, Vref_2, as the (−) input terminal. The output of the amplifier U3A will then provide a voltage, Vbias', at the gate of the FET Q1B such that the drain voltage equals Vref_2. For example, if the drain to source resistance of Q1B is to be set to equal R6 such as 10 KΩ, the drain voltage at Q1B will be 50% of Vref or the drain voltage at QIB=50% of 0.1 volt=0.05 volt or +50 mV DC at the drain of Q1B. VR2 is then set or adjusted to provide Vref_2=+50 mV DC. Of course other values of Vref_2 can be set by VR2 to provide other values of the drain to source resistance of Q1B. With Q1A being substantially matched to Q1B, the same gate voltage, Vbias', is provided or supplied to the gate of Q1A via amplifier A102 (e.g., unity gain amplifier) and R1 (e.g., R1=10KΩ, but other resistance values may be used), which then provides the same drain to source resistance (e.g., 10 KΩ in this example; or other resistance values may be predetermined) as Q1B. FIG. 20 shows an example voltage controlled attenuator via Vin, C8, Rs, Q1A, A101, and Vout. Other circuits such as phase shifter and or gyrator circuits previous shown or mentioned may include the Q1A FET or the FIG. 20 circuit for providing a predetermined drain to source resistance. One novel aspect of FIG. 20 is that regardless of which part number, batch, or production run of matched FETs (e.g., for Q1A and Q1B) are used that have varying pinch off voltages $V_p$ or drain current $I_{DSS}$ specifications, this circuit will provide automatic biasing to the gate of the FET for a predetermined drain to source resistance. Note that two or more matched FETs may be used to provide one or more matched predetermined drain to source resistance. For example, if reference FET QIB were matched to a Q1A, Q1C, Q1D, ... and so on, the FETs Q1A, Q1C, Q1D, ... and so on will have the same drain to source resistance as reference FET Q1B (e.g., via Vbias').

In FIG. 20, U3A may require frequency compensation to avoid oscillation via a compensating capacitor (e.g., C5) coupled to the output of U3A and the (−) input of U3A. Of course other methods of frequency compensation may be provide such as coupling one or more capacitors at the gate and or drain of Q1B to provide a roll-off in frequency response that enables stable operation without oscillation in U3A.

In FIG. 20 a modulated drain to source resistance may be provided by coupling a signal to the gate of Q1A via signal source Vww and C3, and or coupling or combining a signal on either side of R8 (note that R8 is shown to have 10KΩ of resistance, but other resistance values may be used), or combining or coupling a modulating signal to the wiper of VR2, or coupling a modulating to the (−) input terminal of U3A. Diode D1 in FIG. 20 has its anode coupled to the gate of Q1B and to the input terminal of A102. To ensure proper start-up of the bias servo circuit in FIG. 20, D1 ensures that the gate terminals of Q1B and Q1A avoid being forward biased, which may cause U3A to latch to a positive voltage, which would be incorrect since the N channel (e.g., depletion mode) devices of Q1B and Q1A require a non positive voltage their gate terminals or generally a negative bias voltage at their gate terminals. Diode D1 may include a germanium diode or a Schottky diode, which either or both provide forward diode drop voltages less than the forward bias drop voltage across the gate and source of the FETs Q1B and Q1A. The gate terminals of Q1A and Q1B are biased with substantially the same DC voltage to ensure substantially equal quiescent drain to source resistance for Q1B and Q1A. Modulation of the drain to source resistance of Q1A is provided by AC coupling voltage signal Vww via C3 to the gate of Q1A. DC biasing to Q1A is provided by R1 via the output of A102. The output voltage or signal from A102 is substantially the same as the gate terminal voltage of Q1B.

Figure 21:
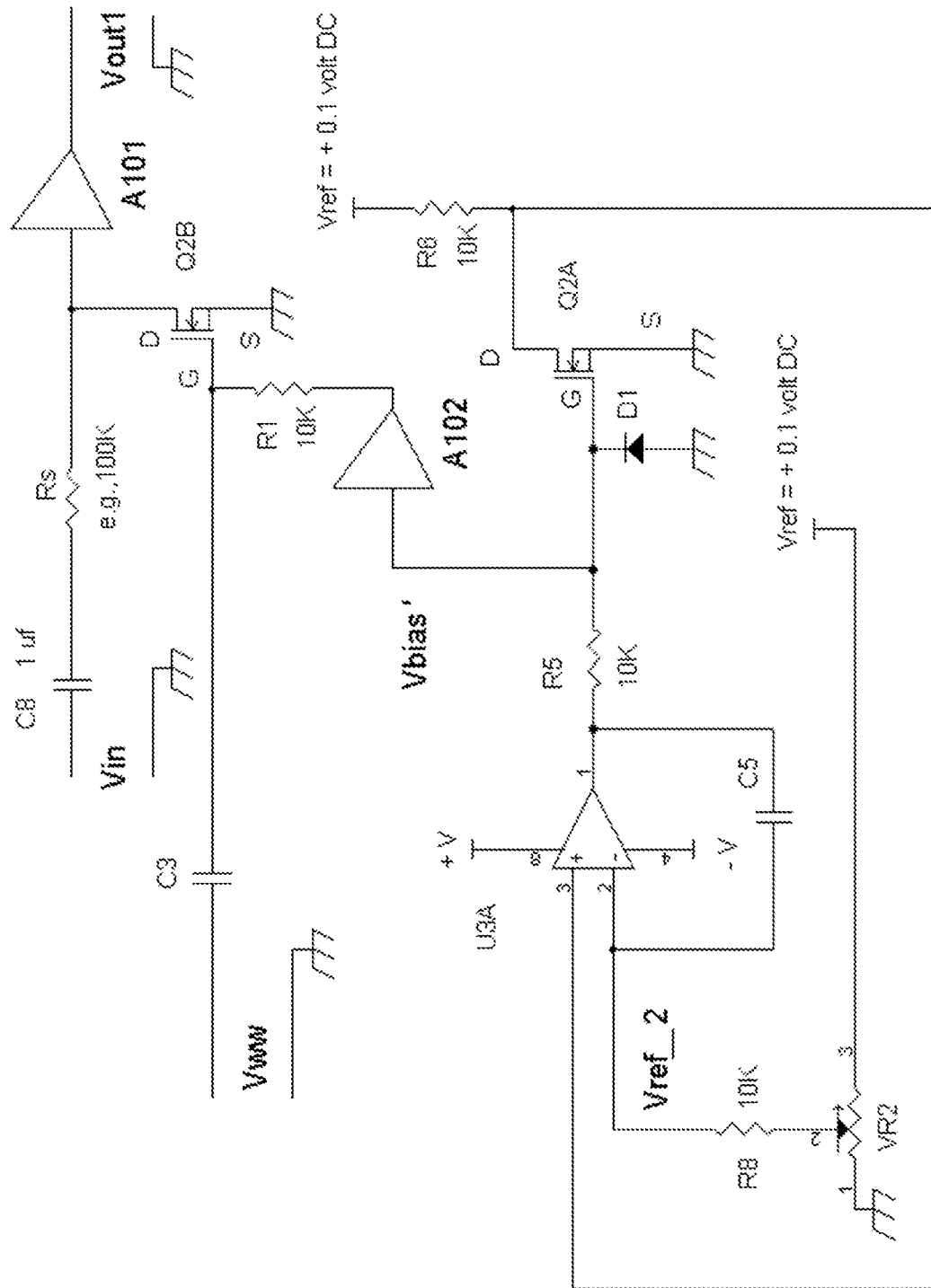
FIG. 21 shows another example embodiment of an automatic bias circuit for providing one or more pre-determined voltage controlled resistance.

FIG. 21 shows essentially the same bias servo circuit as FIG. 20, except that the FET devices include enhancement mode FETs or MOSFETs for Q2A and Q2B. Q2A and Q2B are substantially matched FETs. In FIG. 21 the reference FET is shown as Q2A, and adjusting or setting potentiometer VR2 will set up a predetermined drain to source resistance for Q2A. Since the Vbias' voltage provides substantially the same voltage to the gate terminals of Q2A and Q2B, the drain to source resistance of Q2B will be substantially the same drain to source resistance of Q2A. To prevent start-up problems whereby the bias servo circuit can latch, diode D1 (e.g., where diode D1 has its cathode coupled to the gate of Q2A) in FIG. 21 prevents the amplifier U3A to latch to a negative voltage at its output terminal. Diode D1 ensures that amplifier U3A provides a positive voltage at the gate terminals of U2A and U2B. Other descriptions mentioned previously for FIG. 20 can be applied to the circuit in FIG. 21.

Figure 22:
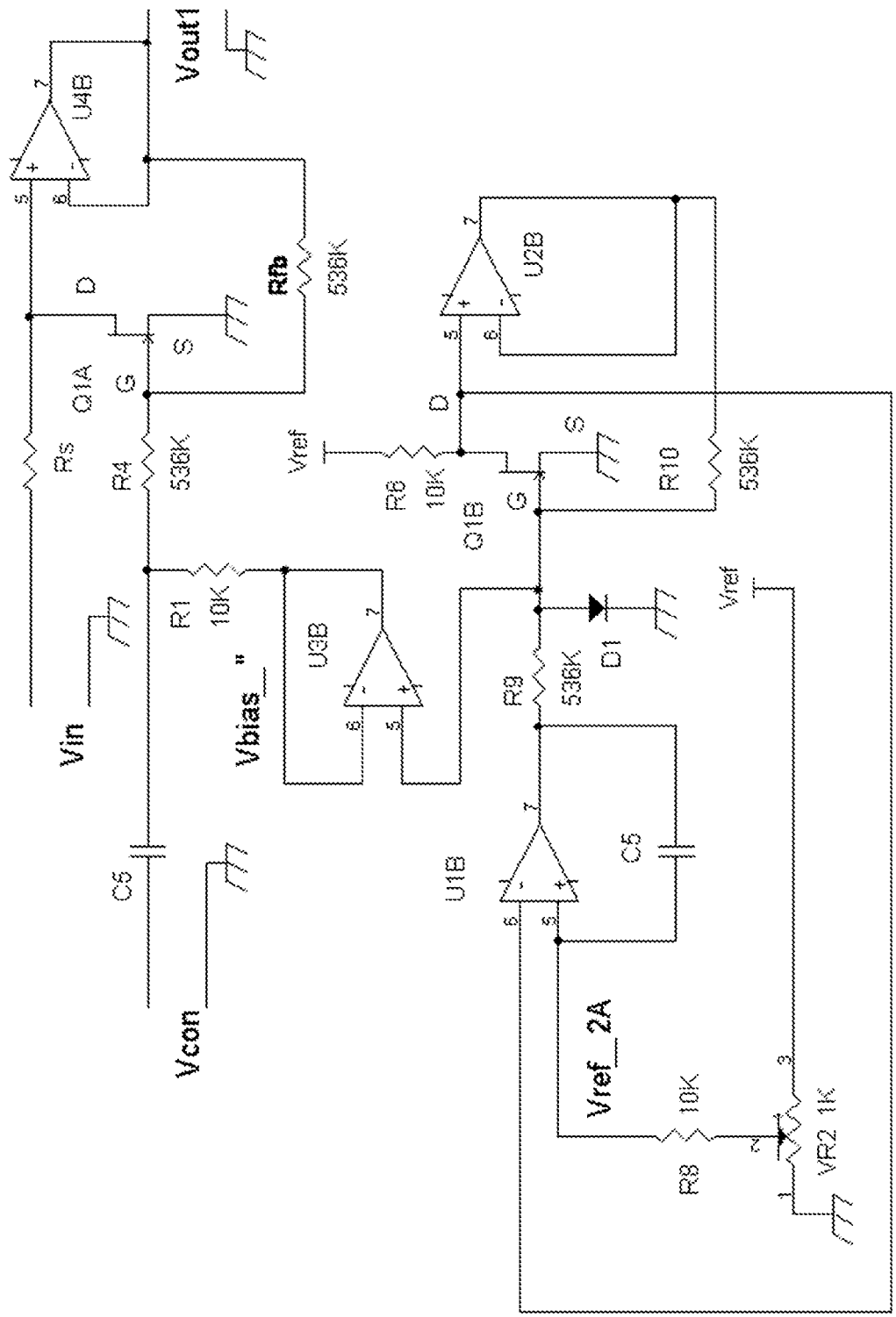
FIG. 22 shows another example embodiment of an automatic bias circuit for providing one or more pre-determined voltage controlled resistance that includes a feedback circuit.

FIG. 22 shows an embodiment that includes drain to source resistance linearization feedback via resistors R10 and R9 for Q1B, and drain to source resistance linearization feedback via resistors Rfb and R4 for Q1A. The bias servo circuit in FIG. 22 includes a Vref voltage coupled to a load resistor R6, and potentiometer or voltage divider circuit to provide voltage at the (−) terminal of amplifier U1B. The reference FET Q1B has its drain terminal coupled to R6 and an input of amplifier U2B. Note that Q1A and Q1B are preferably matched. The output amplifier U2B is coupled to a feedback network, R10 and R9. A first terminal of R10 is coupled to the output of amplifier U2B and a second terminal of R10 is coupled to the gate of Q1B and to the a first terminal of R9. A second terminal of R9 is coupled to the output terminal of amplifier U1B. The output voltage from amplifier U1B couples a voltage to the gate of reference FET Q1B to set a predetermined drain to source resistance of Q1B via adjusting a voltage from VR1 that is coupling a voltage, Vref 2A to the (+) terminal of amplifier U1B. Via negative feedback of U1B, the voltage Vref 2A forces the drain voltage of Q1B to be substantially the same as Vref 2A. A similar voltage controlled resistor circuit with Q1A has the DC gate voltage of Q1A substantially the same as the DC gate voltage of Q1B. The drain to source resistance of Q1A is then substantially the same as the drain to source resistance of Q1B. Both FETs Q1B and Q1A have substantially the same feedback circuit comprising amplifiers U2B with R10 and R9, and also with U4B, Rfb, and R4. Amplifiers U2B and U4B have substantially the same voltage gain, with R10 substantially having equal in resistance value to Rfb, and R9 having substantially equal in resistance value to R4.

Note that although Q1B and Q1A in FIG. 22 are shown as N channel JFET or depletion mode devices, enhancement mode FETs or MOSFETs may be used instead when diode D1 is reversed in connection. That is for N channel enhancement FET, D1 has its cathode coupled to the gate, while the anode of D1 will be coupled to ground. Also note that Vref is coupled to load resistor R6 and VR2.

Alternatively a current source may replace the load resistor R6 in FIG. 20, 21, and or 22. For example if the current source is Iref=10 uA (10 micro-amps) and Vref=0.100 volt is the voltage at the (+) input terminal of amplifier U1B, then the drain to source resistance via the bias servo circuit in FIG. 20, 21, and or 22 will provide a gate to source voltage such that the reference FET drain to source resistance, $R_{ds}$=(Vref/Iref). Preferably, the two FETs shown in FIG. 20, 21, and or 22 are matched. The reference FET in FIG. 20 is Q1B, the reference FET in FIG. 21 is Q2A, and the reference FET in FIG. 22 is Q1B. The drain to source resistances of the associated FETs in FIG. 20, 21, and or 22 will be substantially equal to the drain to source resistances of the reference FET. For example the associated FET in FIG. 20 is Q1A, the associated FET in FIG. 21 is Q2B, and the associated FET in FIG. 22 is Q1A. For FIG. 20, 21, and or 22, if a modulated drain to source resistance is required, the current source, Iref may include a time varying function that includes a DC current and an AC current in the form of Iref(t)=($I_0$+$I_{mod}$(t)), where ($I_0$+$I_{mod}$(t))≥0, where $I_0$ is a DC current and $I_{mod}$(t) is a time varying current or an AC current. Alternatively to provide a modulated drain to source resistance, set a fixed voltage to R6, the modify the Vref that is coupled to VR2 which may be replaced with a voltage source that includes a varying function such as Vref→Vref(t)=($V_0$+$V_{mod}$(t)) where ($V_0$+$V_{mod}$(t))≥0, and where $V_0$=DC voltage, and where $V_{mod}$(t)=an AC voltage or a time varying voltage. The Vref coupled to R6 may be a constant voltage or R6 may be replaced with a DC current source.

This disclosure is illustrative and not limiting; further modifications will be apparent to one skilled in the art and are intended to fall within the scope of the appended claims and or of the embodiments described.

That which is claimed is:

1. A sine wave to triangle wave converter circuit including a first field effect transistor, a second field effect transistor, a third field effect transistor and fourth field effect transistor wherein each of the first, second, third, and fourth field effect transistors include a drain terminal, a gate terminal, and source terminal comprising:
   a sinusoidal signal source coupled to the gate terminals of the first and third field effect transistors;
   coupling to a first voltage potential the gate terminals of the second and fourth field transistors;
   coupling the drain terminal of the first field effect transistor to the drain terminal of the second field effect transistor;
   coupling the drain terminal of the third field transistor to the drain terminal of the fourth field effect transistor;
   coupling the source terminal of the first field effect transistor to the source terminal of the fourth field effect transistor;
   coupling the source terminal of the second field transistor to the source terminal of the third field effect transistor;
   coupling a first current source to the source terminals of the first field effect transistor and the fourth field effect transistor;
   coupling a second current source to the source terminals of the second field effect transistor and the third field effect transistor;
   providing a first output current terminal coupled to the drain terminals of the first and second field effect transistors;
   setting the current of the first current source not equal to the current of the second current source;
   providing a triangle waveform current at the first output current terminal with the sinusoidal signal source.

2. The sine wave to triangle wave converter circuit of claim 1 wherein the first, second, third, and fourth field effect transistors include enhancement mode field effect transistors or MOSFETs.

3. The sine wave to triangle wave converter circuit of claim 1 wherein the first, second, third, and fourth field effect transistors include depletion mode field effect transistors or JFETs.

4. The sine wave to triangle wave converter circuit of claim 1 wherein the first current source includes a direct current source combined with an alternating current source and wherein the second current source includes the direct current source combined with the alternating current source that includes an inverted phase.

5. The sine wave to triangle wave converter circuit of claim 4 wherein the alternating current source provides a modulated triangle wave signal at the first output current terminal.

6. The sine wave to triangle converter circuit of claim 1 further comprising coupling the first output current terminal to a resistor or to an input of a transresistance amplifier.

7. The sine wave to triangle converter circuit of claim 1 wherein the first current source includes a first voltage to current converter circuit and wherein the second current source includes a second voltage to current converter circuit.

* * * * *